(12) United States Patent
Bai et al.

(10) Patent No.: US 12,563,946 B2
(45) Date of Patent: Feb. 24, 2026

(54) DISPLAY SUBSTRATE WITH ISOLATION GROOVE IN PLANARIZATION LAYER AND PREPARATION METHOD THEREOF, AND DISPLAY APPARATUS THEREOF

(71) Applicants:Chengdu BOE Optoelectronics Technology Co., Ltd., Sichuan (CN); BOE Technology Group Co., Ltd., Beijing (CN)

(72) Inventors: Lu Bai, Beijing (CN); Bo Zhang, Beijing (CN); Yang Zhou, Beijing (CN); Junxiu Dai, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/920,404

(22) PCT Filed: Nov. 26, 2021

(86) PCT No.: PCT/CN2021/133589
§ 371 (c)(1),
(2) Date: Oct. 21, 2022

(87) PCT Pub. No.: WO2023/092473
PCT Pub. Date: Jun. 1, 2023

(65) Prior Publication Data
US 2024/0224719 A1     Jul. 4, 2024

(51) Int. Cl.
*H01L 29/08*     (2006.01)
*G09G 3/3233*     (2016.01)
(Continued)

(52) U.S. Cl.
CPC .......... *H10K 59/873* (2023.02); *G09G 3/3233* (2013.01); *H10K 59/1201* (2023.02);
(Continued)

(58) Field of Classification Search
CPC ............... H10K 59/131; H10K 59/873; H10K 59/1201; H10K 59/1213; H10K 59/1216; G09G 3/3233; G09G 2330/021
(Continued)

(56) References Cited

U.S. PATENT DOCUMENTS

2016/0013441 A1     1/2016   Hong
2020/0233522 A1     7/2020   Gwon et al.
(Continued)

FOREIGN PATENT DOCUMENTS

CN         110890475 A       3/2020
CN         210516730 U       5/2020
(Continued)

OTHER PUBLICATIONS

Cite the machine translation Yao X (CN-112838109-A).*
(Continued)

*Primary Examiner* — Phuc T Dang
(74) *Attorney, Agent, or Firm* — Ling Wu; Stephen Yang; Ling and Yang Intellectual Property

(57)     ABSTRACT
A display substrate includes a base substrate, and a drive circuit layer, a first planarization layer, and an organic encapsulation layer disposed on the base substrate sequentially. The first planarization layer has a first isolation groove in a peripheral region. The organic encapsulation layer includes a first portion and a second portion located in the peripheral region. The second portion is located on a side of first portion close to a display region. The second portion has a first height, a height of the first portion gradually decreasing from the first height to a second height along a direction
(Continued)

away from the display region. The first isolation groove is located on a side of first portion close to the display region. An orthographic projection of at least one of the first portion and second portion on the base substrate covers an orthographic projection of the first isolation groove.

19 Claims, 20 Drawing Sheets

(51) Int. Cl.
| | |
|---|---|
| *H10K 59/12* | (2023.01) |
| *H10K 59/121* | (2023.01) |
| *H10K 59/131* | (2023.01) |
| *H10K 59/80* | (2023.01) |

(52) U.S. Cl.
CPC ..... *H10K 59/1213* (2023.02); *H10K 59/1216* (2023.02); *H10K 59/131* (2023.02); *G09G 2330/021* (2013.01)

(58) Field of Classification Search
USPC ........................................................ 257/40
See application file for complete search history.

(56) References Cited

U.S. PATENT DOCUMENTS

| | | | |
|---|---|---|---|
| 2020/0381508 A1* | 12/2020 | Jeon ....................... | H10K 59/38 |
| 2021/0225992 A1 | 7/2021 | Long et al. | |
| 2022/0028933 A1 | 1/2022 | He et al. | |
| 2022/0068212 A1 | 3/2022 | Yao et al. | |

FOREIGN PATENT DOCUMENTS

| | | | | | |
|---|---|---|---|---|---|
| CN | 112582571 A | * | 3/2021 | ......... | H01L 27/3244 |
| CN | 112820753 A | | 5/2021 | | |
| CN | 112838109 A | * | 5/2021 | .......... | G09G 3/3266 |
| CN | 113066434 A | | 7/2021 | | |
| WO | WO-2021212313 A | * | 10/2021 | | |

OTHER PUBLICATIONS

Cite the machine translation Yu P (WO-2021212313-A).*
Cite the machine translation Zhang G (CN-112582571-A).*
Yongwen Zhang, Research of AMOLED Driving Technologies, A Master Thesis Submitted to University of Electronic Science and Technology of China, 2013.

* cited by examiner

DISPLAY SUBSTRATE WITH ISOLATION GROOVE IN PLANARIZATION LAYER AND PREPARATION METHOD THEREOF, AND DISPLAY APPARATUS THEREOF

CROSS-REFERENCE TO RELATED APPLICATIONS

The present application is a U.S. National Phase Entry of International Application PCT/CN2021/133589 having an international filing date of Nov. 26, 2021, and the contents disclosed in the above-mentioned application are hereby incorporated as a part of this application.

TECHNICAL FIELD

The present disclosure relates to, but is not limited to, the field of display technologies, and particularly to a display substrate and a preparation method thereof, and a display apparatus.

BACKGROUND

An Organic Light Emitting Diode (OLED) and a Quantum dot Light Emitting Diode (QLED) are active light emitting display devices and have advantages of self-illumination, a wide viewing angle, a high contrast ratio, low power consumption, an extremely high reaction speed, lightness and thinness, bendability, and a low cost, etc.

SUMMARY

The following is a summary of subject matters described herein in detail. The summary is not intended to limit the protection scope of claims.

Implementations of the present disclosure provide a display substrate and a preparation method thereof, and a display apparatus.

In one aspect, an implementation of the present disclosure provides a display substrate including a base substrate, and a drive circuit layer, a first planarization layer, and an organic encapsulation layer disposed on the base substrate sequentially. The base substrate includes a display region and a peripheral region at least partially surrounding the display region. The drive circuit layer is located in the peripheral region. The first planarization layer has a first isolation groove in the peripheral region. The organic encapsulation layer includes a first portion and a second portion located in the peripheral region. The second portion is located on a side of the first portion close to the display region. The second portion has a first height, and a height of the first portion gradually decreases from the first height to a second height along a direction away from the display region. The first height is greater than the second height. The first isolation groove is located on a side of the first portion close to the display region. An orthographic projection of at least one of the first portion and the second portion of the organic encapsulation layer on the base substrate covers an orthographic projection of the first isolation groove on the base substrate.

In some exemplary implementation modes, the display substrate further includes a second planarization layer located on a side of the first encapsulation layer away from the base substrate. The second planarization layer has a second isolation groove in the peripheral region, and an orthographic projection of the second isolation groove on the base substrate is at least partially overlapped with the orthographic projection of the first isolation groove on the base substrate.

In some exemplary implementation modes, an orthographic projection of the second isolation groove on the base substrate contains the orthographic projection of the first isolation groove on the base substrate.

In some exemplary implementation modes, in the peripheral region, the first isolation groove extends along a direction parallel to an edge of the display region.

In some exemplary implementation modes, the first isolation groove has a first width along the direction away from the display region, and the first width is 4 microns to 15 microns. In a direction perpendicular to the base substrate, the first isolation groove has a first depth, and the first depth is 1.5 microns to 3.5 microns.

In some exemplary implementation modes, the peripheral region includes multiple circuit regions arranged in sequence along the direction away from the display region, and the first isolation groove is located between two adjacent circuit regions.

In some exemplary implementation modes, the multiple circuit regions of the peripheral region include a first circuit region, a second circuit region, and a third circuit region sequentially arranged along the direction away from the display region, or a first circuit region and a second circuit region sequentially arranged along the direction away from the display region. The first isolation groove is located between the first circuit region and the second circuit region.

In some exemplary implementation modes, the multiple circuit regions of the peripheral region at least include a first circuit region, a second circuit region, and a third circuit region arranged in sequence along the direction away from the display region. The first isolation groove is located between the second circuit region and the third circuit region.

In some exemplary implementation modes, the first circuit region is provided with a first drive circuit and multiple first signal lines providing control signals to the first drive circuit, and the second circuit region is provided with a second drive circuit and multiple second signal lines providing control signals to the second drive circuit. The orthographic projection of the first isolation groove on the base substrate is located between the first signal lines and the second drive circuit.

In some exemplary implementation modes, the multiple first signal lines at least include: a first initial signal line providing a first initial signal to the first drive circuit; the multiple second signal lines at least include a first power supply line providing a first voltage signal to the second drive circuit. There is a first distance between an edge in the orthographic projection of the first isolation groove on the base substrate close to the display region and an edge in an orthographic projection of the first initial signal line on the base substrate away from the display region, and there is a second distance between an edge in the orthographic projection of the first isolation groove on the base substrate away from the display region and an edge in an orthographic projection of the first power supply line on the base substrate close to the display region. The first distance is less than the second distance.

In some exemplary implementation modes, the first distance is 3.5 microns to 4.5 microns, and the second distance is 5.5 microns to 7.2 microns.

In some exemplary implementation modes, the first drive circuit is electrically connected with multiple first output signal lines and the second drive circuit is electrically connected with multiple second output signal lines; the third circuit region is provided with a third drive circuit, which is electrically connected with multiple third output signal lines; the first output signal lines, the second output signal lines, and the third output signal lines extend toward a direction of the display region. The orthographic projection of the first isolation groove on the base substrate is overlapped with orthographic projections of the multiple second output signal lines and the multiple third output signal lines on the base substrate.

In some exemplary implementation modes, the display region is provided with multiple pixel circuits. The first drive circuit is configured to provide a reset control signal to multiple pixel circuits of the display region through the first output signal lines. The second drive circuit is configured to provide a scan signal to multiple pixel circuits of the display region through the second output signal lines. The third drive circuit is configured to provide a light emitting control signal to multiple pixel circuits of the display region through the third output signal lines.

In some exemplary implementation modes, the display substrate further includes: a first inorganic encapsulation layer located on a side of the organic encapsulation layer close to the base substrate, a second inorganic encapsulation layer located on a side of the organic encapsulation layer away from the base substrate, and a touch structure layer located on a side of the second inorganic encapsulation layer away from the base substrate. The touch structure layer includes multiple touch leads in the peripheral region. The orthographic projection of the first isolation groove on the base substrate is not overlapped with an orthographic projection of a touch lead on the base substrate, or the orthographic projection of the first isolation groove on the base substrate is overlapped with an orthographic projection of at least one touch lead on the base substrate.

In some exemplary implementation modes, the multiple touch leads include multiple first touch leads, an isolation lead, and multiple second touch leads arranged in sequence along the direction away from the display region. Along the direction away from the display region, the isolation lead has a second width, a first touch lead has a third width, and a second touch lead has a fourth width. The second width is greater than the third width and greater than the fourth width.

In some exemplary implementation modes, a width of the first portion of the organic encapsulation layer is 500 microns to 1000 microns along the direction away from the display region.

In some exemplary implementation modes, the first height is 28 microns to 42 microns.

In some exemplary implementation modes, the second height is 20 microns to 30 microns.

In another aspect, an implementation of the present disclosure provides a display apparatus, which includes the aforementioned display substrate.

In another aspect, an implementation of the present disclosure provides a preparation method of a display substrate. The display substrate includes a display region and a peripheral region at least partially surrounding the display region. The preparation method includes: forming a drive circuit layer in the peripheral region of a base substrate; forming a first planarization layer on a side of the drive circuit layer away from the base substrate, wherein the first planarization layer has a first isolation groove in the peripheral region; and forming an organic encapsulation layer on a side of the first planarization layer away from the base substrate. The organic encapsulation layer includes a first portion and a second portion located in the peripheral region; the second portion is located on a side of the first portion close to the display region; the second portion has a first height, a height of the first portion gradually decreases from the first height to a second height along a direction away from the display region. The first height is greater than the second height. Among them, the first isolation groove is located on a side of the first portion close to the display region, and an orthographic projection of at least one of the first portion and the second portion of the organic encapsulation layer on the base substrate covers an orthographic projection of the first isolation groove on the base substrate.

Other aspects may be understood upon reading and understanding the drawings and the detailed description.

BRIEF DESCRIPTION OF DRAWINGS

Accompanying drawings are used for providing further understanding of technical solutions of the present disclosure, constitute a part of the specification, and together with the implementations of the present disclosure, are used for explaining the technical solutions of the present disclosure but not to constitute limitations on the technical solutions of the present disclosure. Shapes and sizes of one or more components in the drawings do not reflect true scales, and are only intended to schematically describe contents of the present disclosure.

DETAILED DESCRIPTION

Figure 1:
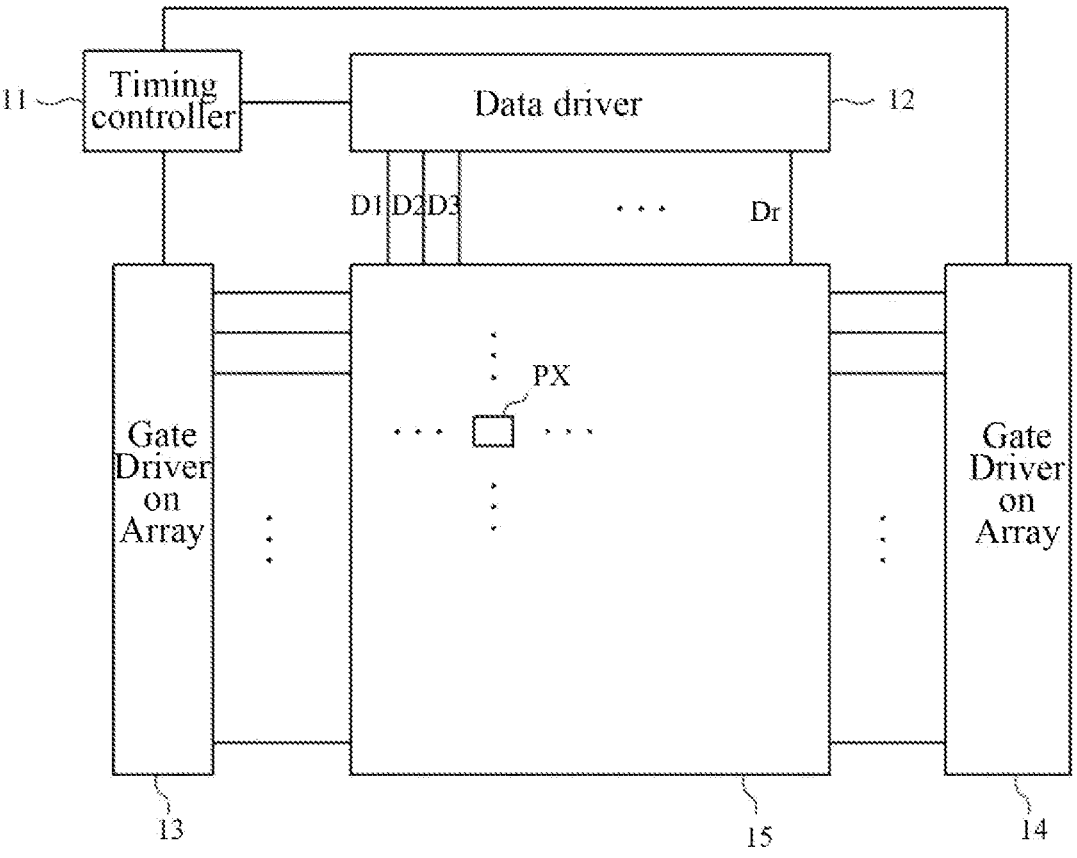
FIG. 1 is a schematic diagram of a structure of a display apparatus according to at least one implementation of the present disclosure.

The implementations of the present disclosure will be described below in combination with the drawings in detail. Implementation modes may be implemented in multiple different forms. Those of ordinary skill in the art may easily understand such a fact that manners and contents may be transformed into other forms without departing from the purpose and scope of the present disclosure. Therefore, the present disclosure should not be explained as being limited to contents described in following implementation modes only. The implementations in the present disclosure and features in the implementations may be combined randomly with each other without conflict.

In the drawings, a size of one or more constituent elements, a thickness of a layer, or a region is sometimes exaggerated for clarity. Therefore, a mode of the present disclosure is not necessarily limited to the size, and a shape and a size of one or more components in the drawings do not reflect a true proportion. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity. In the present disclosure, "multiple" represents two or more than two.

In the specification, for convenience, wordings indicating directional or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between constituent elements are changed as appropriate according to a direction where the constituent elements are described. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above-mentioned terms in the present disclosure according to situations.

In the specification, "electrical connection" includes a case that constituent elements are connected together through an element with a certain electrical effect. The "element having some electrical function" is not particularly limited as long as electrical signals between the connected constituent elements may be transmitted. Examples of the "element having some electrical function" not only include an electrode and a wiring, but further include a switch element such as a transistor, a resistor, an inductor, a capacitor, another element with multiple functions, etc.

In the specification, a transistor refers to an element which at least includes three terminals, i.e., a gate, a drain, and a source. The transistor has a channel region between the drain electrode (drain electrode terminal, drain region, or drain) and the source electrode (source electrode terminal, source region, or source), and a current may flow through the drain electrode, the channel region, and the source electrode. In the specification, the channel region refers to a region through which a current mainly flows.

In the specification, a first electrode may be a drain electrode and a second electrode may be a source electrode, or, a first electrode may be a source electrode and a second electrode may be a drain electrode. In a case that transistors with opposite polarities are used, or in a case that a direction of a current changes during work of a circuit, or the like, functions of the "source electrode" and the "drain electrode" may sometimes be exchanged. Therefore, the "source electrode" and the "drain electrode" may be exchanged in the specification. In addition, the gate may also be referred to as a control pole.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the present disclosure, "about" and "approximate" refer to a case that a boundary is defined not so strictly and a process and measurement error within a range is allowed. In the present disclosure, "substantially the same" is a case where values differ by less than 10%.

With development of flexible OLED display technologies and demand of cost reduction, a touch structure achieved through an integrated process with a backplane (for example, a Flexible Multiple Layer on Cell (FMLOC) process), instead of an external touch structure, is adopted for more and more OLED display panels. The FMLOC process refers to making a touch electrode layer in a shape of a metal grid on an encapsulation layer of a backplane of a display panel, so as to achieve touch control. While preparing the touch electrode layer, a touch wiring layer connected with the touch electrode layer is prepared in a non-display region of the display panel. In order to prevent water vapor from invading a display region, a waterproof groove is usually designed in the non-display region of the backplane of the display panel. However, a design of the waterproof groove will lead to a height section difference in the non-display region, and further lead to metal residues of the touch wiring layer at the height section difference, which will cause a problem of short circuit of a wiring.

An implementation of the present disclosure provides a display substrate, which includes a base substrate, and a drive circuit layer, a first planarization layer, and an organic encapsulation layer disposed on the base substrate sequentially. The base substrate includes a display region and a peripheral region at least partially surrounding the display region. The drive circuit layer is located in the peripheral region. The first planarization layer has a first isolation groove in the peripheral region. The organic encapsulation layer includes a first portion and a second portion located in the peripheral region, and the second portion is located on a side of the first portion close to the display region. The second portion has a first height, and a height of the first portion gradually decreases from the first height to a second height along a direction away from the display region. The first height is greater than the second height. The first isolation groove is located on one side of the first portion close to the display region. An orthographic projection of at least one of the second portion and the first portion of the organic encapsulation layer on the base substrate covers an orthographic projection of the first isolation groove on the base substrate.

In the present disclosure, a "height" means a vertical distance between a surface of a film layer on a side away from the base substrate and the base substrate in a direction perpendicular to the display substrate. For example, a height of the organic encapsulation layer is a vertical distance between a surface of the organic encapsulation layer on a side away from the base substrate and the base substrate in the direction perpendicular to the display substrate.

The display substrate according to this implementation, the first isolation groove is formed on the first planarization layer in the peripheral region, the first isolation groove is used for blocking water vapor from invading the display region, moreover, the organic encapsulation layer covering the first isolation groove has a planarization surface, and there is no height section difference at a recessed position, that is, the organic encapsulation layer may fill up the first isolation groove, avoiding a height section difference in the peripheral region, thereby avoiding a risk of short circuit of touch leads formed on a side of the organic encapsulation layer away from the base substrate.

In some examples, the organic encapsulation layer includes a third portion in the display region, and the second portion of the organic encapsulation layer is communicated with the third portion. The third part has the first height. The second portion and the third portion of the organic encapsulation layer may be referred to as planarization regions. A surface of a planarization region of the organic encapsulation layer away from the base substrate may be substantially parallel to a plane in which the base substrate is located. In this example, surfaces of the second portion and the third portion of the organic encapsulation layer away from the base substrate are flat and have no recessed positions. In some examples, the first height of the organic encapsulation layer may be about 28 microns ($\mu$m) to 42 $\mu$m, and the second height may be about 20 $\mu$m to 30 $\mu$m. However, this implementation is not limited thereto.

In some examples, the first portion of the organic encapsulation layer may be referred to as a climbing region. The climbing region may refer to a region between a cut-off (i.e., at the second height) of the organic encapsulation layer and a 100% height (i.e., at the first height) of the organic encapsulation layer. In a direction perpendicular to the display substrate, the climbing region of the organic encapsulation layer has a gradient along a direction away from the display region. In this example, a surface of the climbing region of the organic encapsulation layer away from the base substrate is also flat and has no recessed position. In some examples, the height of the first portion of the organic encapsulation layer decreases gradually from the first height to the second height along the direction away from the display region, which may include: a decreasing trend of the height of the first portion along the direction away from the display region may conform to a function relationship of a smooth curved surface; or, the height of the first portion of the organic encapsulation layer may decrease in a step-down manner along the direction away from the display region. For example, the first portion may be divided into multiple consecutive sub-portions, heights of the multiple sub-portions may sequentially decrease along the direction away from the display region and there is a same height within the sub-portions; or, the first portion may be divided into multiple consecutive sub-portions, heights of the multiple sub-sections may sequentially decrease along the direction away from the display region, and a height within each sub-portion may also sequentially decrease along the direction away from the display region, wherein a functional relationship satisfied by decrease in heights within the sub-portions may be different from a functional relationship satisfied by decrease in heights between the sub-portions. However, this implementation is not limited thereto. In this example, a change trend of the height of the first portion along the direction away from the display region does not have a change of a sudden increase in height after a sudden decrease in height, nor does it have a change of a sudden decrease in height after a sudden increase in height.

In some examples, an orthographic projection of the second portion of the organic encapsulation layer on the base substrate may cover an orthographic projection of the first isolation groove on the base substrate. In this example, the film layer height section difference produced by the first isolation groove may be filled up through the second portion of the organic encapsulation layer, and the second portion of the organic encapsulation layer maintains a flat surface. Or, in some examples, an orthographic projection of the first portion of the organic encapsulation layer on the base substrate may cover an orthographic projection of the first isolation groove on the base substrate. In this example, the film layer height section difference produced by the first isolation groove may be filled up through the first portion of the organic encapsulation layer, and the first portion of the organic encapsulation layer maintains a flat surface. Or, in some examples, orthographic projections of the first portion and the second portion of the organic encapsulation layer on the base substrate may both be overlapped with an orthographic projection of the first isolation groove on the base substrate. In this example, the orthographic projection of the first isolation groove on the base substrate may be overlapped with a junction of the orthographic projections of the first portion and the second portion of the organic encapsulation layer on the base substrate. The film layer height section difference produced by the first isolation groove may be filled up together by the first portion and the second portion of the organic encapsulation layer, and the organic encapsulation layer maintains a flat surface. However, this implementation is not limited thereto.

In some exemplary implementation modes, the display substrate further includes a second planarization layer located on a side of the first planarization layer away from the base substrate. The second planarization layer has a second isolation groove in the peripheral region, an orthographic projection of the second isolation groove on the base substrate is at least partially overlapped with an orthographic projection of the first isolation groove on the base substrate. In some examples, the orthographic projection of the second isolation groove on the base substrate may include the orthographic projection of the first isolation groove on the base substrate. However, this implementation is not limited thereto. In this example, the organic encapsulation layer may fill up the first isolation groove and the second isolation groove, and maintain a flat surface.

In some exemplary implementation modes, the first isolation groove has a first width along the direction away from the display region. The first width may be about 4 μm to 15 μm, for example, it may be about 10 μm. The first isolation groove has a first depth in a direction perpendicular to the base substrate. The first depth may be about 1.5 μm to 3.5 μm, for example, may be about 1.5 μm or 2 μm.

In the present disclosure, a "width" refers to a dimension in a direction perpendicular to an extension direction. For example, a width of the first isolation groove may be a dimension of the orthographic projection of the first isolation groove on the base substrate in the direction perpendicular to the extension direction. A depth of a groove represents a vertical distance between a side surface of a film layer forming the groove away from the base substrate and a bottom surface of the groove in a direction perpendicular to the display substrate.

In some exemplary implementation modes, the peripheral region may include multiple circuit regions arranged in sequence along the direction away from the display region. The first isolation groove may be located between two adjacent circuit regions. In some examples, the peripheral region may include two circuit regions and the first isolation groove may be located between the two circuit regions. Or, the peripheral region may include three or more circuit regions, and the first isolation groove may be located between two adjacent circuit regions on a side close to the display region. Or, the peripheral region may include three or more circuit regions, and the first isolation groove may be located between any two adjacent circuit regions. However, this implementation is not limited thereto.

Solutions of the implementation will be described below through some examples.

FIG. 1 is a schematic diagram of a structure of a display apparatus according to at least one implementation of the present disclosure. In some exemplary implementation modes, as shown in FIG. 1, the display apparatus may include a timing controller 11, a data driver 12, Gate Driver on Arrays 13 and 14, and a sub-pixel array 15. The sub-pixel array 15 is located in the display region and includes multiple sub-pixels PX arranged regularly. The Gate Driver on Arrays 13 and 14 may be located in peripheral regions on opposite sides of a periphery of the display region. For example, the Gate Driver on Arrays 13 and 14 may each include: a scan drive circuit, a light emitting drive circuit, and a reset drive circuit. The scan drive circuit may be configured to provide a scan signal to a sub-pixel PX along a scan line. The light emitting drive circuit may be configured to provide a light emitting control signal to a sub-pixel PX along a light emitting control line. The reset drive circuit may be configured to provide a reset control signal to a sub-pixel PX along a reset control line. The data driver 12 is configured to provide a data signal to a sub-pixel PX along a data line. The timing controller 11 is configured to control the Gate Driver on Arrays 13 and 14 and the data driver 12.

In some exemplary implementation modes, the timing controller 11 may provide a gray-scale value and a control signal that are suitable for a specification of the data driver 12 to the data driver 12. The timing controller 11 may provide a clock signal, an initial signal, and the like that are suitable for specifications of the Gate Driver on Arrays 13 and 14 to the Gate Driver on Arrays 13 and 14. The data driver 12 may generate a data voltage to be provided to data lines D1 to Dr, using the gray-scale value and the control signal received from the timing controller 11. For example, the data driver 12 may sample the gray-scale value using a clock signal and apply a data signal corresponding to the gray-scale value on the data lines D1 to Dr by taking a row of sub-pixels as a unit. Herein, r is a natural number. The Gate Driver on Arrays 13 and 14 may generate gate control signals (e.g., scan signals and light emitting control signals) to be provided to gate lines (e.g., scan lines and light emitting control lines) through the clock signal, the initial signal, and the like received from the timing controller 11. For example, the scan drive circuit may sequentially provide scan signals with on-level pulses to scan lines. In some examples, the scan drive circuit may include a shift register and may generate a scan signal by means of sequentially transmitting a scan initial signal provided in a form of an on-level pulse to a next-stage circuit under control of a clock signal. For example, the light emitting drive circuit may provide sequentially light emitting control signals with off-level pulses to light emitting control lines. The light emitting drive circuit may include a shift register, and generate a light emitting control signal by means of sequentially transmitting a light emitting initial signal provided in a form of an off-level pulse to a next-stage circuit under control of a clock signal.

Figure 2:
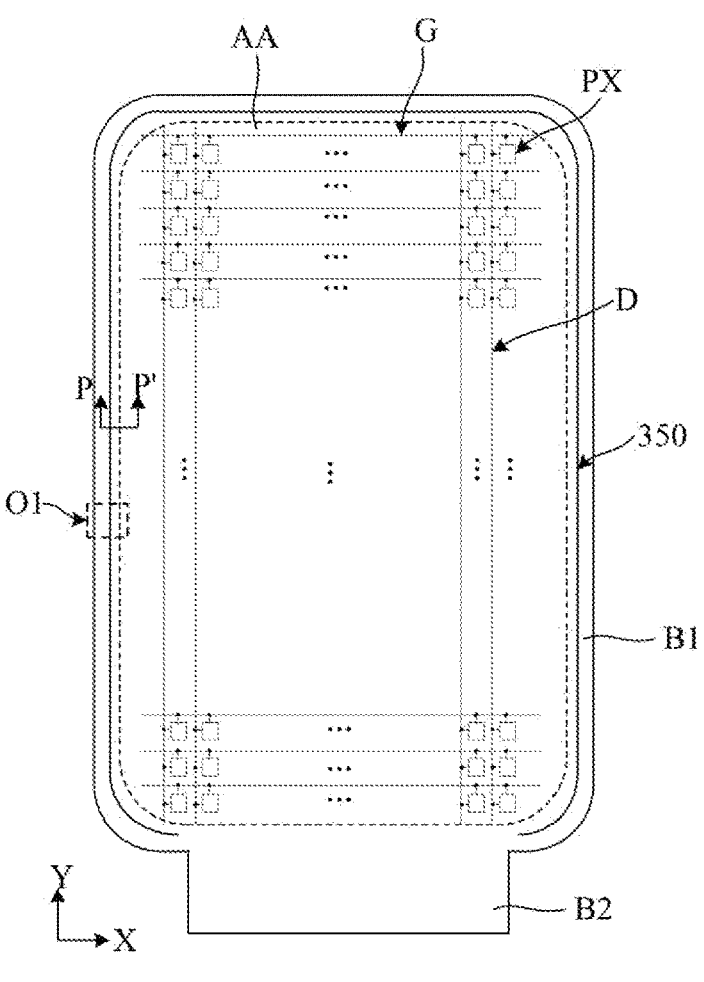
FIG. 2 is a schematic diagram of a structure of a display substrate according to at least one implementation of the present disclosure.

FIG. 2 is a schematic diagram of a structure of a display substrate according to at least one implementation of the present disclosure. In some exemplary implementation modes, as shown in FIG. 2, the display substrate of this implementation may include a display region AA and a non-display region located at a periphery of the display region AA. The non-display region includes a bonding region B2 located on one side of the display region AA and a peripheral region B1 located on a remaining side of the display region AA. The bonding region B2 and the peripheral region B1 are communicated and surround the display region AA. For example, the peripheral region B1 may include an upper border, a left border, and a right border of the display substrate, and the bonding region B2 may include a lower border of the display substrate. However, this implementation is not limited thereto.

In some exemplary implementation modes, as shown in FIG. 2, the display region AA at least includes multiple sub-pixels PX, multiple gate lines G, and multiple data lines D. The multiple gate lines G extend along a first direction X and are arranged along a second direction Y sequentially. The multiple data lines D extend along the second direction Y and are arranged along the first direction X sequentially. The first direction X and the second direction Y intersect, for example, they are perpendicular to each other. Orthographic projections of the multiple gate lines G on the base substrate intersect orthographic projections of the multiple data lines D on the base substrate to form multiple sub-pixel regions, and one sub-pixel PX is disposed in each sub-pixel region. The sub-pixel PX may include a pixel circuit and a light emitting element electrically connected with the pixel circuit. The multiple data lines D are electrically connected with multiple sub-pixels PX and are configured to provide data signals to the multiple sub-pixels PX. The multiple gate lines G are electrically connected with the multiple sub-pixels PX and are configured to provide gate control signals (e.g., scan signals) to the multiple sub-pixels PX. In some examples, the pixel circuit may be of a 7T1C (i.e., seven transistors and one capacitor) structure, a 3T1C (i.e., three transistors and one capacitor) structure, or a 5T1C (i.e., five transistors and one capacitor) structure. The light emitting element may be an OLED device, including an anode and a cathode that are stacked, and an organic emitting layer sandwiched between the anode and the cathode. However, this implementation is not limited thereto.

In some exemplary implementation modes, a pixel unit may include three sub-pixels, i.e., a red sub-pixel, a green sub-pixel, and a blue sub-pixel respectively. However, this implementation is not limited thereto. In some examples, a pixel unit may include four sub-pixels, and the four sub-pixels may be a red sub-pixel, a green sub-pixel, a blue sub-pixel, and a white sub-pixel respectively. In some examples, the sub-pixel may be shaped into a rectangle, a rhombus, a pentagon, or a hexagon. When a pixel unit includes three sub-pixels, the three sub-pixels may be arranged side by side horizontally, side by side vertically, or in a shape of a Chinese character "品". When a pixel unit includes four sub-pixels, the four sub-pixels may be arranged side by side horizontally, side by side vertically, or in a shape of a square. However, this implementation is not limited thereto.

In some exemplary implementation modes, the Gate Driver on Array (GOA) may be directly disposed on the base substrate. For example, multiple drive circuits may be disposed in peripheral regions B1 (e.g., the first peripheral region and the third peripheral region) on left and right sides of the display region AA. In some examples, the multiple drive circuits may be formed together with a pixel circuit of a sub-pixel in a process of forming the sub-pixel. However, positions of the multiple drive circuits or a manner in which the multiple drive circuits is formed are not limited in this implementation.

In some exemplary implementation modes, the data driver 12 may be disposed on a separate chip or printed circuit board so as to be connected with a sub-pixel through a signal access pin provided in the bonding region B2 of the base substrate. For example, the data driver 12 may be disposed in the bonding region in a form of chip-on-glass, chip-on-plastic, chip-on-film, etc., so as to be connected with the signal access pin on the base substrate. The timing controller 11 may be provided separately from the data driver 12 or provided integrally with the data driver 12. However, this implementation is not limited thereto.

Figure 3:
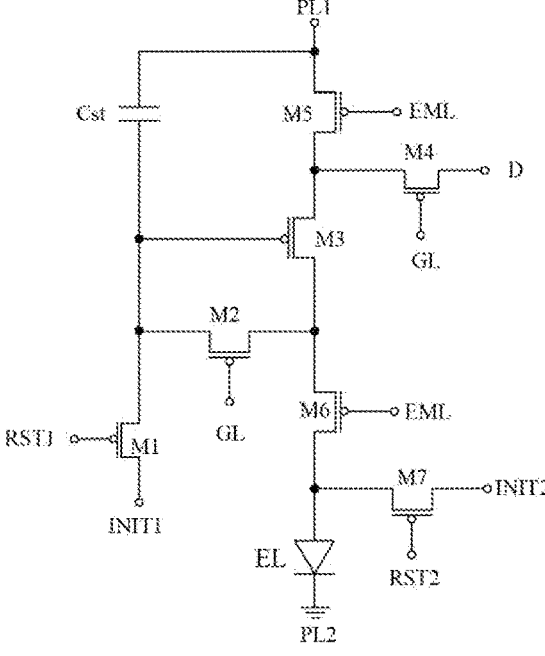
FIG. 3 is an equivalent circuit diagram of a pixel circuit according to at least one implementation of the present disclosure.
Figure 4:
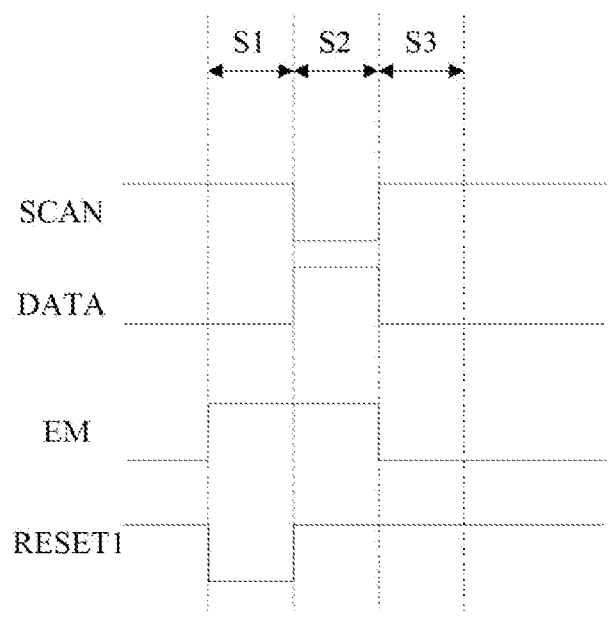
FIG. 4 is a working timing diagram of the pixel circuit provided in FIG. 3.

FIG. 3 is an equivalent circuit diagram of a pixel circuit according to at least one implementation of the present disclosure. FIG. 4 is a working timing diagram of the pixel circuit provided in FIG. 3.

In some exemplary implementation modes, as shown in FIG. 3, the pixel circuit of this exemplary implementation may include: six switching transistors (M1, M2, and M4 to M7), a drive transistor M3, and a storage capacitor Cst. The six switching transistors are respectively a data writing transistor M4, a threshold compensation transistor M2, a first light emitting control transistor M5, a second light emitting control transistor M6, a first reset transistor M1, and a second reset transistor M7. A light emitting element EL may include an anode, a cathode, and an organic emitting layer disposed between the anode and the cathode.

In some exemplary implementation modes, the drive transistor and the six switching transistors may be P-type transistors or may be N-type transistors. Adopting a same type of transistors in a pixel circuit may simplify a process flow, reduce a process difficulty of a display substrate, and improve a yield of products. In some exemplary implementation modes, the drive transistor and the six switching transistors may include a P-type transistor and an N-type transistor.

In some exemplary implementation modes, Low Temperature Poly-Silicon thin film transistors, or oxide thin film transistors, or a Low Temperature Poly-Silicon thin film transistor and an oxide thin film transistor may be adopted for the drive transistor and the six switching transistors. An active layer of a Low Temperature Poly-Silicon thin film transistor is made of Low Temperature Poly-Silicon (LTPS), and an active layer of an oxide thin film transistor is made of an oxide semiconductor (Oxide). A Low-temperature Poly-Silicon thin film transistor has advantages such as a high mobility and fast charging, while an oxide thin film transistor has an advantage such as a low leakage current. The Low Temperature Poly-Silicon thin film transistor and the oxide thin film transistor are integrated on one display substrate to form a Low Temperature Polycrystalline Oxide (LTPO) display substrate, and advantages of both the Low Temperature Poly-Silicon thin film transistor and the oxide thin film transistor may be utilized, which may achieve low frequency drive, reduce power consumption, and improve display quality.

In some exemplary implementation modes, as shown in FIG. 3, a pixel circuit is connected with a scan line GL, a data line DL, a first power supply line PL1, a second power supply line PL2, a light emitting control line EML, a first initial signal line INIT1, a second initial signal line INIT2, a first reset control line RST1, and a second reset control line RST2. In some examples, the first power supply line PL1 is configured to provide a constant first voltage signal VDD to the pixel circuit, the second power supply line PL2 is configured to provide a constant second voltage signal VSS to the pixel circuit, and the first voltage signal VDD is greater than the second voltage signal VSS. The scan line GL is configured to provide a scan signal SCAN to the pixel circuit, the data line D is configured to provide a data signal DATA to the pixel circuit, the light emitting control line EML is configured to provide a light emitting control signal EM to the pixel circuit, the first reset control line RST1 is configured to provide a first reset control signal RESET1 to the pixel circuit, and the second reset control line RST2 is configured to provide a second reset signal RESET2 to the pixel circuit. In some examples, in a row of pixel circuits, the second reset control line RST2 may be connected with the scan line GL to be input with the scan signal SCAN. That is, a second reset signal $RESET2(n)$ received by a pixel circuit of an n-th row is a scan signal $SCAN(n)$ received by the pixel circuit of the n-th row. However, this implementation is not limited thereto. For example, the second reset control signal line RST2 may be inputted with a second reset control signal RESET2 different from the scan signal SCAN. In some examples, in a pixel circuit of an n-th row, a first reset control line RST1 may be connected with a scan line GL of a pixel circuit of an (n−1)-th row to be inputted with a scan signal $SCAN(n−1)$, that is, a first reset control signal $RESET1(n)$ is the same as the scan signal $SCAN(n−1)$. Thus, signal lines of the display substrate may be reduced, and a narrow frame of the display substrate may be achieved.

In some exemplary implementation modes, as shown in FIG. 3, a drive transistor M3 is electrically connected with a light emitting element EL, and outputs a drive current to drive the light emitting element EL to emit light under control of a scan signal SCAN, a data signal DATA, a first voltage signal VDD, a second voltage signal VSS and etc. A gate of a data writing transistor M4 is electrically connected with a scan line GL, a first electrode of the data writing transistor M4 is electrically connected with a data line D, and a second electrode of the data writing transistor M4 is electrically connected with a first electrode of the drive transistor M3. A gate of a threshold compensation transistor M2 is electrically connected with a scan line GL, a first electrode of the threshold compensation transistor M2 is electrically connected with a gate of the drive transistor M3, and a second electrode of the threshold compensation transistor M2 is electrically connected with a second electrode of the drive transistor M3. A gate of a first light emitting control transistor M5 is electrically connected with a light emitting control line EML, a first electrode of the first light emitting control transistor M5 is electrically connected with a first voltage line PL1, and a second electrode of the first light emitting control transistor M5 is electrically connected with the first electrode of the drive transistor M3. A gate of a second light emitting control transistor M6 is electrically connected with the light emitting control line EML, a first electrode of the second light emitting control transistor M6 is electrically connected with the second electrode of the drive transistor M3, and a second electrode of the second light emitting control transistor M6 is electrically connected with an anode of the light emitting element EL. A first reset transistor M1 is electrically connected with the gate of the drive transistor M3 and configured to reset the gate of the drive transistor M3, and a second reset transistor M7 is electrically connected with the anode of the light emitting element EL and configured to reset the anode of the light emitting element EL. A gate of the first reset transistor M1 is electrically connected with a first reset control line RST1, a first electrode of the first reset transistor M1 is electrically connected with a first initial signal line INIT1, and a second electrode of the first reset transistor M1 is electrically connected with the gate of the drive transistor M3. A gate of the second reset transistor M7 is electrically connected with a second reset control line RST2, a first electrode of the second reset transistor M7 is electrically connected with a second initial signal line INIT2, and a second electrode of the second reset transistor M7 is electrically connected with the anode of the light emitting element EL. A first electrode of a storage capacitor Cst is electrically connected with the gate of the drive transistor M3, and a second electrode of the storage capacitor Cst is electrically connected with the first voltage line PL1.

A working process of the pixel circuit shown in FIG. 3 will be described below with reference to FIG. 4. The description is given by taking a case in which multiple transistors included in the pixel circuit shown in FIG. 3 are all P-type transistors as an example.

In some exemplary implementation modes, as shown in FIG. 3 and FIG. 4, during one frame display period, the working process of the pixel circuit may include a first stage S1, a second stage S2, and a third stage S3.

The first stage S1 is referred to as a reset stage. A first reset control signal RESET1 provided by the first reset control line RST1 is a low-level signal, so that the first reset transistor M1 is turned on, and a first initial signal provided by the first initial signal line INIT1 is provided to the gate of the drive transistor M3 to initialize the gate of the drive transistor M3 and clear an original data voltage in the storage capacitor Cst. A scan signal SCAN provided by the scan line GL is a high-level signal, and a light emitting control signal EM provided by the light emitting control line EML is a high-level signal, so that the data writing transistor M4, the threshold compensation transistor M2, the first light emitting control transistor M5, the second light emitting control transistor M6, and the second reset transistor M7 are turned off. In this stage, the light emitting element EL does not emit light.

The second stage S2 is referred to as a data writing stage or a threshold compensation stage. A scan signal SCAN provided by the scan line GL is a low-level signal, a first reset control signal RESET1 provided by the first reset control line RST1 and a light emitting control signal EM provided by the light emitting control line EML are both high-level signals, and the data line D outputs a data signal DATA. In this stage, the second electrode of the storage capacitor Cst is at a low level, so that the drive transistor M3 is turned on. The scan signal SCAN is a low-level signal, so that the threshold compensation transistor M2, the data writing transistor M4, and the second reset transistor M7 are turned on. The threshold compensation transistor M2 and the data writing transistor M4 are turned on, so that a data voltage Vdata output by the data line D is provided to the gate of the drive transistor M3 through the turned-on drive transistor M3 and the turned-on threshold compensation transistor M2, and the storage capacitor Cst is charged with a difference between the data voltage Vdata output by the data line D and a threshold voltage of the drive transistor M3. A voltage of the second electrode of the storage capacitor Cst is Vdata-|Vth|, wherein Vdata is the data voltage output by the data line D, and Vth is the threshold voltage of the drive transistor M3. The second reset transistor M7 is turned on, so that a second initial signal provided by the second initial signal line INIT2 is provided to the anode of the light emitting element EL to initialize (reset) the anode of the light emitting element EL and clear a pre-stored voltage therein, so as to complete initialization, thereby ensuring that the light emitting element EL does not emit light. The first reset control signal RESET1 provided by the first reset control line RST1 is a high-level signal, so that the first reset transistor M1 is turned off. The light emitting control signal EM provided by the light emitting control signal line EML is a high-level signal, so that the first light emitting control transistor M5 and the second light emitting control transistor M6 are turned off.

The third stage S3 is referred to as a light emitting stage. A light emitting control signal EM provided by the light emitting control signal line EML is a low-level signal, and a scan signal SCAN provided by the scan line GL and a first reset control signal RESET1 provided by the first reset control line RST1 are high-level signals. The light emitting control signal EM provided by the light emitting control signal line EML is a low-level signal, so that the first light emitting control transistor M5 and the second light emitting control transistor M6 are turned on, and a first voltage signal VDD output by the first power supply line PL1 provides a drive voltage to the anode of the light emitting element EL through the turned-on first light emitting control transistor M5, the drive transistor M3, and the second light emitting control transistor M6 to drive the light emitting element EL to emit light.

In a drive process of a pixel circuit, a drive current flowing through the drive transistor M3 is determined by a voltage difference between the gate and the first electrode of the drive transistor M3, and the drive current of the drive transistor M3 is as follows.

$$I = K * (Vgs - Vth)^2 =$$
$$K * [(VDD - V \text{ data} + |V th|) - Vth]^2 = K * [(VDD - V \text{ data}]^2$$

I is the drive current flowing through the drive transistor M3, that is, the drive current for driving the light emitting element EL; K is a constant; Vgs is the voltage difference between the gate and the first electrode of the drive transistor M3; Vth is the threshold voltage of the drive transistor M3; Vdata is the data voltage output by the data line D; and VDD is a first voltage signal output by the first power supply line PL1.

It may be seen from the above formula that a current flowing through the light emitting element EL has nothing to do with the threshold voltage of the drive transistor M3. Therefore, the pixel circuit of this implementation may better compensate the threshold voltage of the drive transistor M3.

Figure 5:
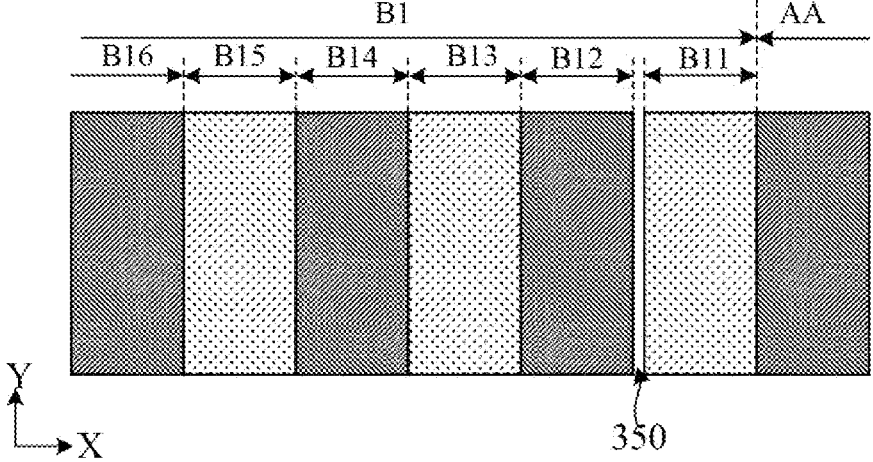
FIG. 5 is a schematic diagram of a planar structure of a peripheral region of a display substrate according to at least one implementation of the present disclosure.

FIG. 5 is a schematic diagram of a planar structure of a peripheral region of a display substrate according to at least one implementation of the present disclosure. FIG. 5 is a partial schematic diagram of a region O1 in FIG. 2. In some exemplary implementation modes, in a plane parallel to the display substrate, a peripheral region B1 may include multiple circuit regions (e.g., a first circuit region B11, a second circuit region B12, and a third circuit region B13), an isolation region B14, a crack dam region B15, and a cutting region B16 arranged in sequence along a direction away from a display region AA. A first isolation groove 350 is located between the first circuit region B11 and the second circuit region B12. As shown in FIG. 2, in the peripheral region B1, the first isolation groove 350 extends along a direction parallel to an edge of the display region AA. However, this implementation is not limited thereto.

In some exemplary implementation modes, the first circuit region B11 may include a first drive circuit and multiple first signal lines that output control signals (e.g., clock signals, initial signals, and power supply signals) to the first drive circuit. The first drive circuit is configured to output a first drive signal to a pixel circuit of the display region AA. The second circuit region B12 may include a second drive circuit and multiple second signal lines outputting control signals to the second drive circuit. The second drive circuit is configured to output a second drive signal to the pixel circuit of the display region AA. The third circuit region may include a third drive circuit and multiple third signal lines outputting control signals to the third drive circuit. The third drive circuit is configured to output a third drive signal to the pixel circuit of the display region AA.

In some exemplary implementation modes, the first drive signal may be a reset control signal, the second drive signal may be a scan signal, and the third drive signal may be a light emitting control signal. For example, the first drive circuit may provide a first reset signal to the pixel circuit through a first reset control line and provide a second reset control signal to the pixel circuit through a second reset control line; the second drive circuit may provide a scan signal to the pixel circuit through a scan line; the third drive circuit may provide a light emitting control signal to the pixel circuit through a light emitting control line. However, this implementation is not limited thereto. For example, the first drive signal may be a scan signal, the second drive signal may be a reset control signal, and the third drive signal may be a light emitting control signal.

In some exemplary implementation modes, the first drive circuit may include multiple first sub-drive circuits cascaded, and the multiple first sub-drive circuits may be sequentially disposed along a second direction Y. A first sub-drive circuit is electrically connected with a first output signal line, and the first output signal line may extend along a first direction X to the display region AA. For example, the first output signal line may be electrically connected with a first reset control line and a second reset control line of the display region. The second drive circuit may include multiple second sub-drive circuits cascaded. The multiple second sub-drive circuits may be disposed in sequence along the second direction Y. A second sub-drive circuit is electrically connected with a second output signal line, and the second output signal line may extend along the first direction X to the display region AA. For example, the second output signal line may be electrically connected with a scan line of the display region. The third drive circuit may include multiple third sub-drive circuits cascaded, and the multiple third sub-drive circuits may be sequentially disposed along the second direction Y. A third sub-drive circuit is electrically connected with a third output signal line, the third output signal line may extend along the first direction X to the display region AA. For example, the third output signal line may be electrically connected with a light emitting control line of the display region. However, this implementation is not limited thereto.

In some exemplary implementation modes, a first sub-drive circuit and a second sub-drive circuit may all be of an 8T2C (i.e., eight transistors and two capacitors) structure, a third sub-drive circuit may be of a 10T3C (i.e., ten transistors and three capacitors) structure or a 12T2T (i.e., twelve transistors and two capacitors) structure. However, this implementation is not limited thereto.

In some exemplary implementation modes, the isolation region B14 may include a second voltage line, a first isolation dam, and a second isolation dam. The second voltage line may extend along a direction parallel to an edge of the display region AA, and the second voltage line is configured to output a second voltage signal VSS to multiple pixel circuits in the display region AA. The first isolation dam and the second isolation dam may extend along the direction parallel to the edge of the display region AA, and are configured to block an organic encapsulation layer in an encapsulation layer and to block water vapor from entering the display region AA. The crack dam region may include multiple cracks, and the multiple cracks are configured to reduce forces on the display region 100, and cut off transmission of cracks to a direction of the display region AA, so as to avoid affecting a film layer structure of the display region AA. The cutting region B16 may include at least one cutting groove, and the cutting groove is configured so that after all film layers of the display substrate are prepared, a cutting device cuts along the cutting groove.

Figure 6:
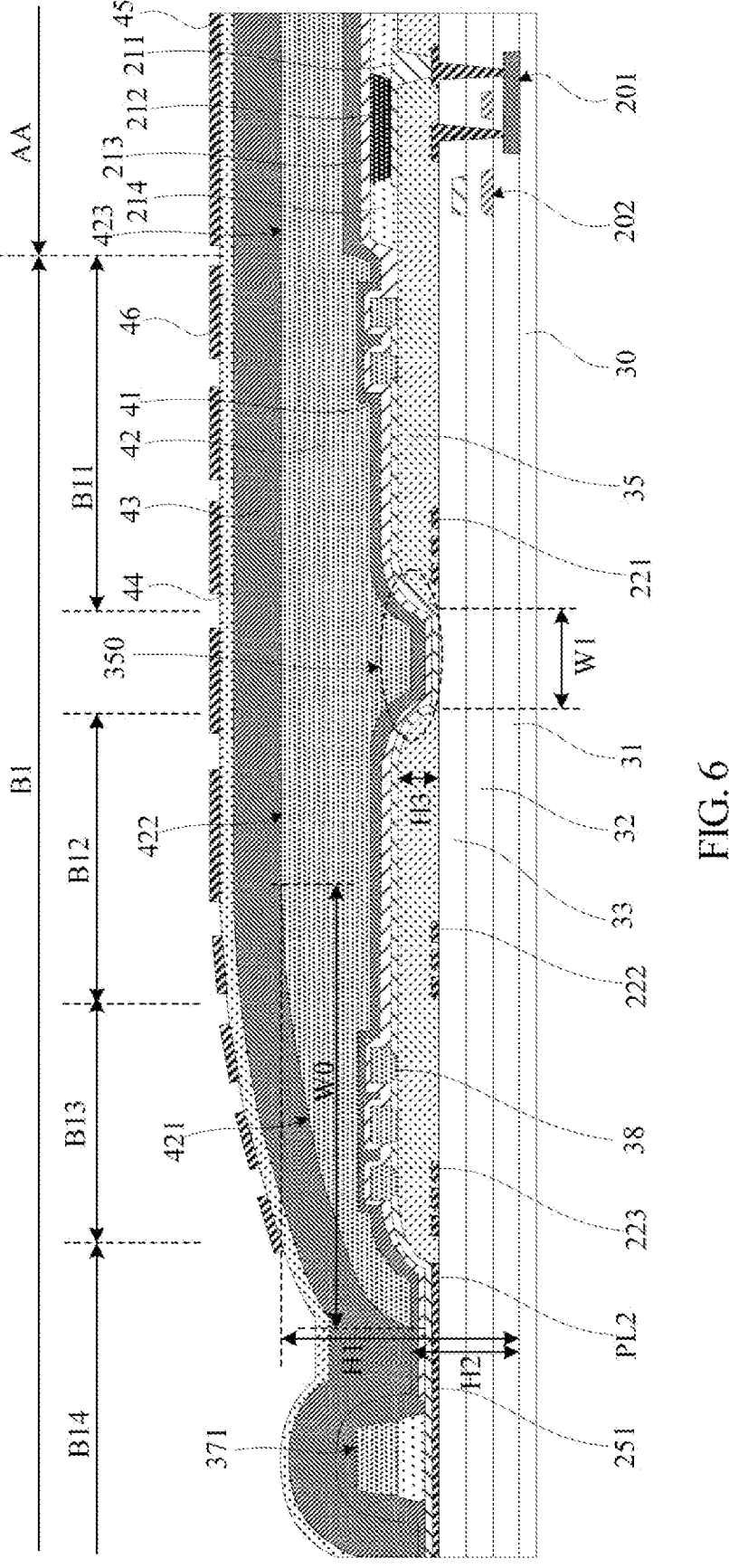
FIG. 6 is a partial cross-sectional schematic diagram along a P-P' direction in FIG. 2.

FIG. 6 is a partial cross-sectional schematic diagram along a P-P' direction in FIG. 2. In some exemplary implementation modes, as shown in FIG. 6, in a direction perpendicular to a display substrate, a display region AA may include a base substrate 30, and a pixel circuit layer, a first planarization layer 35, a light emitting structure layer, an encapsulation layer, a protective layer 44, and a touch structure layer that are sequentially disposed on the base substrate 30. The touch structure layer of the display region AA at least includes multiple touch electrodes 45. A peripheral region B1 may include the base substrate 30, and a drive circuit layer, the first planarization layer 35, the encapsulation layer, the protective layer 44, and the touch structure layer that are sequentially disposed on the base substrate 30. The touch structure layer of the peripheral region B1 at least includes multiple touch leads 46. However, this implementation is not limited thereto.

In some exemplary implementation modes, the pixel circuit layer of the display region AA may include multiple pixel circuits. At least one pixel circuit includes multiple transistors and at least one storage capacitor. In FIG. 6, it is illustrated by taking one transistor 201 and one storage capacitor 202 of one pixel circuit as an example. The drive circuit layer of the peripheral region B1 may include a Gate Driver on Array and multiple signal lines configured to provide control signals to the Gate Driver on Array. In FIG. 6, it is illustrated by taking several first signal lines 221 configured in the first circuit region B11 to provide control signals to the first drive circuit, several second signal lines 222 configured in the second circuit region B12 to provide control signals to the second drive circuit, and several third signal lines 223 configured in the third circuit region B13 to provide control signals to the third drive circuit as an example.

In some exemplary implementation modes, in a direction perpendicular to the display substrate, the drive circuit layer and the pixel circuit layer may include: a semiconductor layer disposed on the base substrate 30, a first insulation layer 31 covering the semiconductor layer, a first conductive layer disposed on the first insulation layer 31, a second insulation layer 32 covering the first conductive layer, a second conductive layer disposed on the second insulation layer 32, a third insulation layer 33 covering the second conductive layer, and a third conductive layer disposed on the third insulation layer 33. For example, the transistor 201 of the display region AA may include: a first active layer located in the semiconductor layer, a control electrode located in the first conductive layer, and a first electrode and a second electrode located in the third conductive layer. The storage capacitor 202 may include a first capacitor electrode plate located in the first conductive layer and a second capacitor electrode plate located in the second conductive layer. However, this implementation is not limited thereto.

In some exemplary implementation modes, as shown in FIG. 6, the third conductive layer of the peripheral region B1 is illustrated by taking a first signal line 221 located in the first circuit region B11, a second signal line 222 located in the second circuit region B12, and a third signal line 223 located in the third circuit region B13 as an example. Regarding a film layer structure of a transistor and a storage capacitor of the Gate Driver on Array of the peripheral region B1, reference may be made to the film layer structure of the pixel circuit of the display region AA, so illustration is omitted here. The third conductive layer of the peripheral region B1 may also include a second voltage line PL2.

In some exemplary implementation modes, as shown in FIG. 6, the light emitting structure layer of the display region AA may include multiple film layers constituting a light emitting element. The multiple film layers may include an anode 211, a pixel definition layer 214, a cathode 213, and an organic emitting layer 212 sandwiched between the anode 211 and the cathode 213. The anode 211 is connected with a drain electrode of the transistor 201 through a via. The organic emitting layer 212 is connected with the anode 211, the cathode 213 is connected with the organic emitting layer 212, and the organic emitting layer 212 emits light of a corresponding color under drive of the anode 211 and the cathode 213. In some examples, the organic emitting layer 212 may include an Emitting Layer (EML), as well as any one or more of following layers: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In some examples, hole injection layers, hole transport layers, and electron block layers of all sub-pixels in the display region may be a common layer connected together, hole block layers, electron transport layers, and electron injection layers of all the sub-pixels may be a common layer connected together, and emitting layers of adjacent sub-pixels may be overlapped slightly, or may be isolated. However, this implementation is not limited thereto.

In some exemplary implementation modes, as shown in FIG. 6, the peripheral region B1 is further provided with a first connection electrode 251, and the first connection electrode 251 and the anode 211 are of a same layer structure. A part of the first connection electrode 251 is electrically connected with the second voltage line PL2. The first connection electrode 251 is provided with multiple vias. The second voltage line PL2 may be electrically connected with the cathode 213 through the first connection electrode 251.

In some exemplary implementation modes, as shown in FIG. 6, a first planarization layer 35 is located on a side of the third conductive layer away from the base substrate 30. The first planarization layer 35 has a first isolation groove 350 in the peripheral region B1. The first isolation groove 350 is located between the first circuit region B11 and the second circuit region B12. The first connection electrode 251, the cathode 213, a first inorganic encapsulation layer 41, and an organic encapsulation layer 42 are sequentially disposed in the first isolation groove 350.

In some exemplary implementation modes, as shown in FIG. 6, the first isolation Groove 350 has a first width W1 along a direction away from the display region AA. The first width W1 may be about 4 μm to 15 μm, for example, it may be about 10 μm. The first isolation groove 350 has a first depth H3 in a direction perpendicular to the base substrate 30. The first depth H3 may be about 1.5 μm to 3.5 μm, for example, may be about 2 μm. However, this implementation is not limited thereto. In this example, by providing the first isolation groove having the first width and the first depth, it is advantageous to release water vapor and block the water vapor from invading the display region.

In this example, the first depth of the first isolation groove 350 and a thickness of the first planarization layer 35 may be substantially the same. For example, the first planarization layer 35 in the first isolation groove 350 is completely removed and a surface of the third insulation layer 33 may be exposed. However, this implementation is not limited thereto. In other examples, the first depth of the first isolation groove may be less than the thickness of the first planarization layer. For example, a part of the first planarization layer 35 in the first isolation groove 350 may be removed and a part of the first planarization layer 35 may be retained.

In the present disclosure, a "thickness" refers to a vertical distance between a surface of a film layer on a side away from a base substrate and a surface of the film layer on a side close to the base substrate in a direction perpendicular to a display substrate. In the present disclosure, a height of the film layer may be greater than the thickness.

In some exemplary implementation modes, as shown in FIG. 6, the encapsulation layer may include a first inorganic encapsulation layer 41, an organic encapsulation layer 42, and a second inorganic encapsulation layer 43 that are stacked. The first inorganic encapsulation layer 41 and the second inorganic encapsulation layer 43 may be made of an inorganic material, and the organic encapsulation layer 42 may be made of an organic material. The organic encapsulation layer 42 is disposed between the first inorganic encapsulation layer 41 and the second inorganic encapsulation layer 43 to form an inorganic material/organic material/inorganic material laminated structure, which may ensure that external water vapor cannot enter the light emitting structure layer.

In some exemplary implementation modes, as shown in FIG. 6, the organic encapsulation layer 42 has a first portion 421, a second portion 422, and a third portion 423 that are continuous. The third portion 423 is located in the display region AA and the first portion 421 and the second portion 422 are located in the peripheral region B1. The second portion 422 is located on a side of the first portion 421 close to the display region AA. The third portion 423 and the second portion 422 of the organic encapsulation layer 42 each have a first height H1. A height of the first portion 421 gradually decreases from the first height H1 to a second height H2 along a direction away from the display region AA. In this example, the first portion 421 forms a ramp surface.

In some exemplary implementation modes, as shown in FIG. 6, a width W0 of the first portion 421 of the organic encapsulation layer 42 may be about 500 μm to 1000 μm, for example, may be about 1000 μm. The first height H1 of the organic encapsulation layer 42 may be about 28 μm to 42 μm, for example, may be about 35 μm. The second height H2 may be about 20 μm to 30 μm, for example, may be about 25 μm. The first height of the organic encapsulation layer of this example may ensure that a film layer height section difference generated by the first isolation groove 350 is filled up so as to ensure planarization of a surface of an encapsulation layer on a side away from the base substrate 30.

In this exemplary implementation mode, as shown in FIG. 6, the first isolation groove 350 is located on a side of the first portion 421 of the organic encapsulation layer 42 close to the display region AA. And an orthographic projection of the first isolation groove 350 on the base substrate 30 and an orthographic projection of the first portion 421 of the organic encapsulation layer 42 on the base substrate 30 are not overlapped. An orthographic projection of the second portion 422 of the organic encapsulation layer 42 on the base substrate 30 may cover the orthographic projection of the first isolation groove 350 on the base substrate 30. In this example, the first portion 421, the second portion 422, and the third portion 423 of the organic encapsulation layer 42 are communicated to form a flat surface, that is, a surface of the organic encapsulation layer 42 on a side away from the base substrate 30 has no recessed position. Although providing the first isolation groove 350 in the first planarization layer 35 will cause a height section difference of film layers, a film layer height section difference generated by the first isolation groove 350 may be filled up through the second portion 422 of the organic encapsulation layer 42, thereby ensuring planarization of a surface of an encapsulation layer on a side away from the base substrate 30. Thus the protective layer 44 formed on a side of the encapsulation layer away from the base substrate 30 also has a flat surface. The touch structure layer formed on a side of the encapsulation layer away from the base substrate 30 may be formed on the protective layer 44 having the flat surface, thereby avoiding a risk of short circuit caused by residual glue during a preparation process of the touch structure layer due to concavity and convex of a surface of the encapsulation layer.

In some exemplary implementation modes, as shown in FIG. 6, the isolation region B14 has a first isolation dam 371 and a second isolation dam (not shown in the figure). The second isolation dam is located on a side of the first isolation dam 371 away from the display region AA. The first isolation dam 371 is formed by laminating a first dam foundation and a second dam foundation. For example, the first dam foundation of the first isolation dam 371 and the pixel definition layer 214 may be of a same layer structure, and the second dam foundation and an isolation pillar layer 38 may be of a same layer structure. The second isolation dam may be formed by laminating the first dam foundation, the second dam foundation, and a third dam foundation. The first dam foundation of the second isolation dam and the first planarization layer 35 may be of a same layer structure, the second dam foundation and the pixel definition layer 214 may be of a same layer structure, and the third dam foundation and the isolation pillar layer 38 may be of a same layer structure. The isolation pillar layer 38 may be located on a side of the pixel definition layer 214 away from the base substrate 30. A second voltage line provided in the isolation region B14 is located in the third conductive layer and is electrically connected with the cathode 213 through the first connection electrode 251 provided in a same layer as the anode. An orthographic projection of the second voltage line PL2 of the isolation region B14 on the base substrate 30 may be overlapped with both an orthographic projection of the first isolation dam 371 and an orthographic projection of the second isolation dam on the base substrate 30. However, this implementation is not limited thereto.

In some exemplary implementation modes, a minimum pitch between an edge of an outermost touch lead 46 of the touch structure layer (i.e., a touch lead farthest from the display region AA along a direction away from the display region AA) away from the display region AA and an edge of the first isolation dam 371 on a side close to the display region AA may be about 90 μm to 110 μm, for example, may be about 100 μm. However, this implementation is not limited thereto.

In some exemplary implementation modes, a fourth conductive layer and a second planarization layer are also disposed between the first planarization layer 35 and the anode. The peripheral region of the display substrate of this implementation will be described below by taking a case in which both the first sub-drive circuit and the second sub-drive circuit are of an 8T2C structure as an example. In the following example, a circuit structure of 10T3C may be adopted for the third sub-drive circuit. However, this implementation is not limited thereto.

Figure 7:
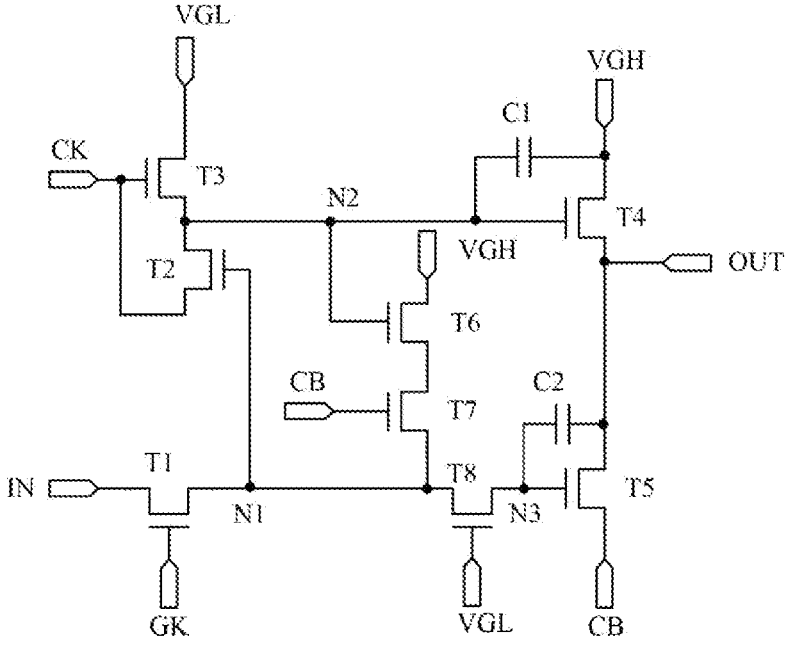
FIG. 7 is an equivalent circuit diagram of a first sub-drive circuit according to at least one implementation of the present disclosure.

FIG. 7 is an equivalent circuit diagram of a first sub-drive circuit according to at least one implementation of the present disclosure. As shown in FIG. 7, the first sub-drive circuit according to this exemplary implementation may include a first transistor T1 to an eighth transistor T8, a first storage capacitor C1 and a second storage capacitor C2. The fourth transistor T4 and the fifth transistor T5 are output transistors of the first sub-drive circuit.

In some exemplary implementation modes, as shown in FIG. 7, a control electrode of the first transistor T1 is electrically connected with a first clock signal terminal CK, a first electrode of the first transistor T1 is electrically connected with an input terminal IN, and a second electrode of the first transistor T1 is electrically connected with a first node N1. A control electrode of the second transistor T2 is electrically connected with the first node N1, a first electrode of the second transistor T2 is electrically connected with the first clock signal line CK, and a second electrode of the second transistor T2 is electrically connected with a second node N2. A control electrode of the third transistor T3 is electrically connected with the first clock signal line CK, a first electrode of the third transistor T3 is electrically connected with a second power supply line VGL, and a second electrode of the third transistor T3 is electrically connected with the second node N2. A control electrode of the fourth transistor T4 is electrically connected with the second node N2, a first electrode of the fourth transistor T4 is electrically connected with a first power supply line VGH, and a second electrode of the fourth transistor T4 is electrically connected with an output terminal OUT. A control electrode of the fifth transistor T5 is electrically connected with a third node N3, a first electrode of the fifth transistor T5 is electrically connected with a second clock signal terminal CB, and a second electrode of the fifth transistor T5 is electrically connected with the output terminal OUT. A control electrode of the sixth transistor T6 is electrically connected with the second node N2, a first electrode of the sixth transistor T6 is electrically connected with the first power supply line VGH, and a second electrode of the sixth transistor T6 is electrically connected with a first electrode of the seventh transistor T7. A control electrode of the seventh transistor T7 is electrically connected with the second clock signal terminal CB, and a second electrode of the seventh transistor T7 is electrically connected with the first node N1. A control electrode of the eighth transistor T8 is electrically connected with the second power supply line VGL, a first electrode of the eighth transistor T8 is electrically connected with the first node N1, and a second electrode of the eighth transistor T8 is electrically connected with the third node N3. A first electrode of the first storage capacitor C1 is electrically connected with the first power supply line VGH, and a second electrode of the first storage capacitor C1 is electrically connected with the second node N2. A second electrode of the second storage capacitor C2 is electrically connected with the output terminal OUT, and a first electrode of the second storage capacitor C2 is electrically connected with the third node N3.

In this exemplary implementation mode, the first node N1 is a connection point of the first transistor T1, the second transistor T2, the seventh transistor T7, and the eighth transistor T8. The second node N2 is a connection point of the second transistor T2, the third transistor T3, the fourth transistor T4, the sixth transistor T6, and the first storage capacitor C1. The third node N3 is a connection point of the eighth transistor T8, the fifth transistor T5, and the second storage capacitor C2.

In some exemplary implementation modes, the first transistor T1 to the eighth transistor T8 of the first sub-drive circuit shown in FIG. 7 may all be P-type transistors or N-type transistors. However, this implementation is not limited thereto.

Figure 8:
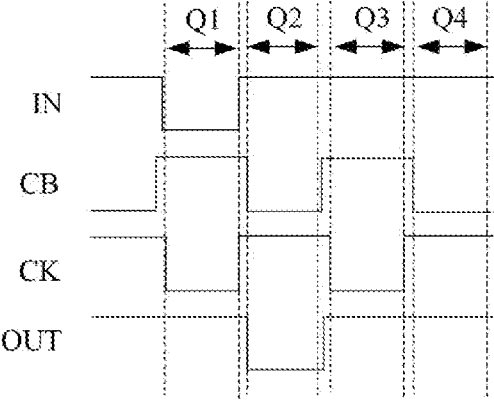
FIG. 8 is a working timing diagram of the first sub-drive circuit shown in FIG. 7.

In some exemplary implementation modes, description is given by taking a case in which the first transistor T1 to the eighth transistor T8 of the first sub-drive circuit shown in FIG. 7 are all P-type transistors, as an example. A case in which an input terminal IN of a first sub-drive circuit of a first stage is electrically connected with a first initial signal line, is taken as an example. FIG. 8 is a working timing diagram of the first sub-drive circuit shown in FIG. 7. As shown in FIGS. 7 and 8, the first sub-drive circuit of this exemplary implementation includes eight transistor units (i.e., the first transistor T1 to the eighth transistor T8), two capacitor units (i.e., the first storage capacitor C1 and the second storage capacitor C2), three input terminals (i.e., the first clock signal terminal CK, the second clock signal terminal CB, and the input terminal IN), one output terminal (i.e., the output terminal OUT), and two power supply terminals (i.e., the first power supply line VGH and the second power supply line VGL). Among them, the first power supply line VGH provides a high-level signal continuously, and the second power supply line VGL provides a low-level signal continuously.

As shown in FIGS. 7 and 8, a working process of the first sub-drive circuit of this implementation may include following stages.

In a first stage Q1, the first clock signal terminal CK provides a low-level first clock signal, the input terminal IN receives a low-level trigger signal, so the first transistor T1 and the third transistor T3 are turned on, and the turned-on first transistor T1 transmits the low-level trigger signal to the first node N1, so that a level of the first node N1 becomes a low level, so the second transistor T2 and the fifth transistor T5 are turned on. Since the eighth transistor T8 is always in an on state in response to a low level provided by the second power supply line VGL, a level of the third node N3 is the same as that of the first node N1, that is, the low level, and at the same time, this low level is stored in the second storage capacitor C2. In addition, the turned-on third transistor T3 transmits a low level to the second node N2, the turned-on second transistor T2 transmits a first clock signal to the second node N2, so that a level of the second node N2 becomes a low level, and is stored in the first storage capacitor C1, so the fourth transistor T4 is turned on in response to the low level of the second node N2, a high level provided by the first power supply line VGH is output to the output terminal OUT, at the same time, the fifth transistor T5 is turned on in response to the low level of the third node N3 and transmits a high-level second clock signal provided by the second clock signal terminal CB to the output terminal OUT, so that the first sub-drive circuit outputs a high level in this stage.

In a second stage Q2, the second clock signal terminal CB provides a low-level second clock signal, so the seventh transistor T7 is turned on, and the first clock signal terminal CK provides a high-level first clock signal, so the first transistor T1 and the third transistor T3 are turned off. Due to a storage function of the second storage capacitor C2, the first node N1 may continue to maintain the low level of a previous stage, so the second transistor T2 and the fifth transistor T5 are turned on. Since the second transistor T2 is turned on, the high-level first clock signal of the first clock signal terminal CK is transmitted to the second node N2, and the second node N2 becomes to be at a high level. Therefore, the sixth transistor T6 and the fourth transistor T4 are turned off, thereby preventing the high level provided by the first power supply line VGH from being output to the output terminal OUT and the first node N1. Since the fifth transistor T5 is turned on, in this stage, the output terminal OUT outputs a low level transmitted by the second clock signal terminal CB.

In a third stage Q3, the first clock signal terminal CK provides a low-level first clock signal, so the first transistor T1 and the third transistor T3 are turned on. At this time, a high level provided by the first initial signal line is transmitted to the first node N1 and the third node N3, so the fifth transistor T5 and the second transistor T2 are turned off. The second clock signal terminal CB receives a high-level second clock signal, and the seventh transistor T7 is turned off. Since the third transistor T3 is turned on, a low level provided by the second power supply line VGL is transmitted to the second node N2 and stored in the first storage capacitor C1, therefore, the fourth transistor T4 and the sixth transistor T6 are turned on, and in this stage, the output terminal OUT outputs a high level provided by the first power supply line VGH.

In a fourth stage Q4, the first clock signal terminal CK provides a high-level first clock signal, so the first transistor T1 and the third transistor T3 are turned off. The second clock signal terminal CB provides a low-level second clock signal, so the seventh transistor T7 is turned on. Due to a storage function of the second storage capacitor C2, a level of the first node N1 maintains a high level of a previous stage, so that the second transistor T2 and the fifth transistor T5 are turned off. Due to a storage function of the first storage capacitor C1, the second node N2 continues to maintain a low level of a previous stage, so that the sixth transistor T6 is turned on, and a high level provided by the first power supply line VGH is transmitted to the first node N1 and the third node N3 through the turned-on sixth transistor T6 and the seventh transistor T7, so that the first node N1 and the third node N3 continue to be kept at a high level, effectively preventing the fifth transistor T5 from being turned on, thereby avoiding an erroneous output.

Figure 9:
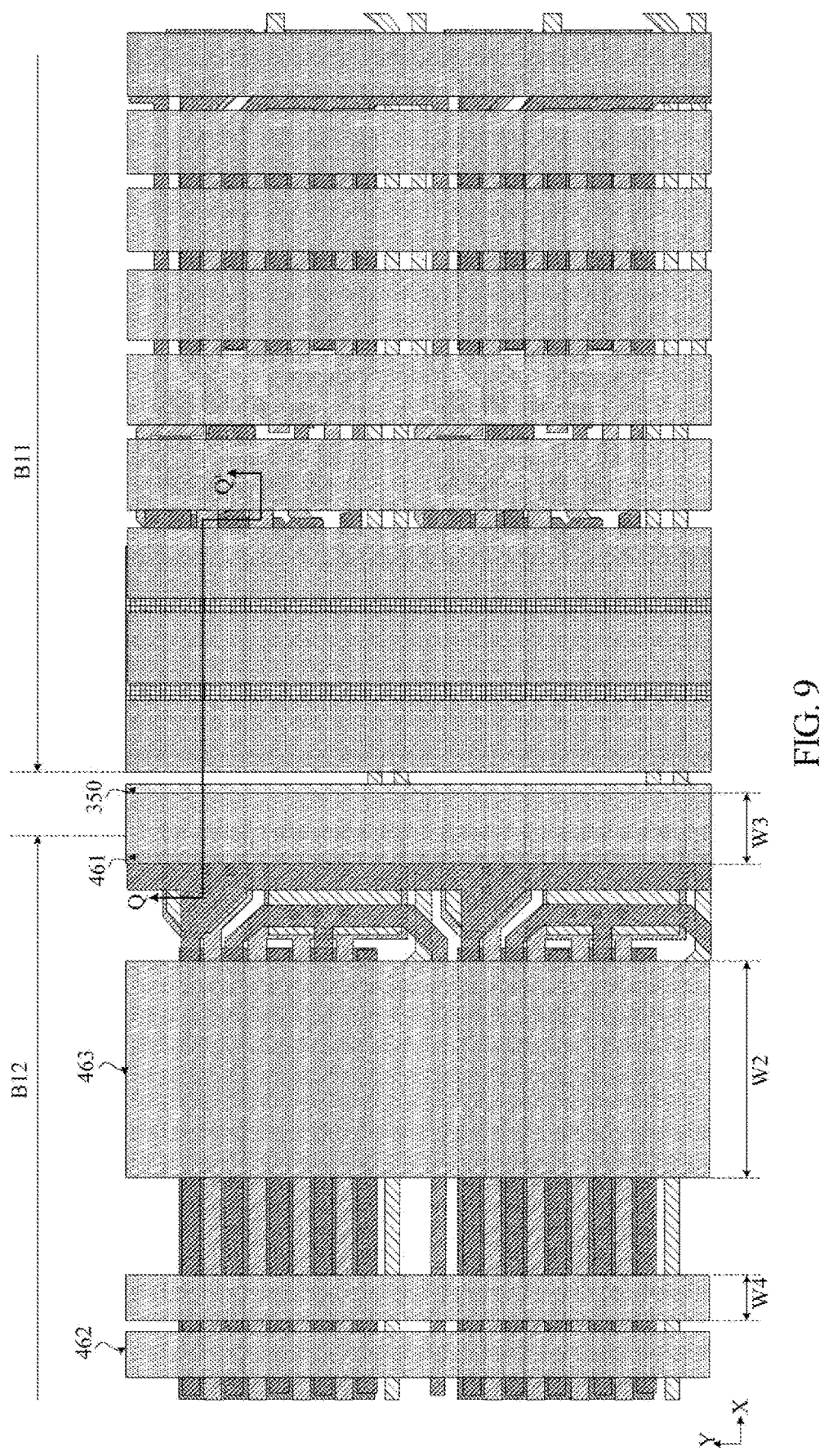
FIG. 9 is a partial top schematic view of a peripheral region according to at least one implementation of the present disclosure.

FIG. 9 is a partial top view schematic diagram of a peripheral region according to at least one implementation of the present disclosure, such as a partial top view schematic diagram of a region O1 in FIG. 2. Two cascaded first sub-drive circuits located in the first circuit region B11 and a part of two cascaded second sub-drive circuits located in the second circuit region B12 are illustrated in FIG. 9. In some examples, a planar structure of a second sub-drive circuit is similar to a planar structure of a first sub-drive circuit, which will not be repeated here.

Figure 10:
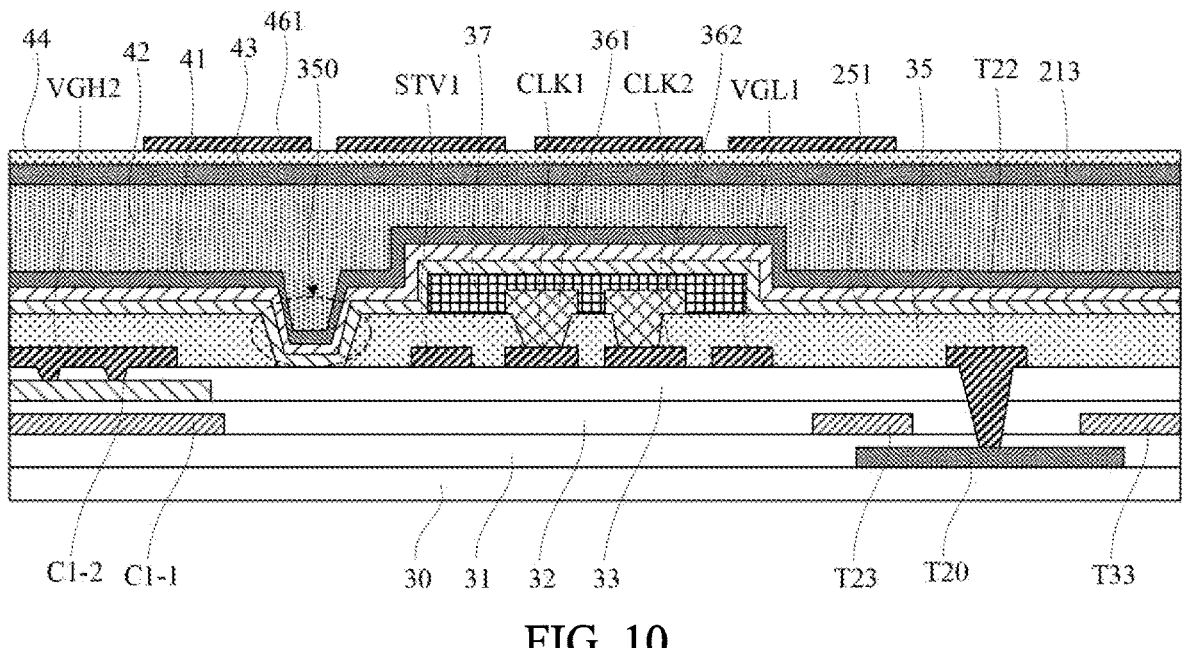
FIG. 10 is a partial cross-sectional schematic diagram along a Q-Q' direction in FIG. 9.

FIG. 10 is a partial cross-sectional schematic diagram along a Q-Q' direction in FIG. 9. In some exemplary implementation modes, in a plane perpendicular to a base substrate, as shown in FIG. 10, a peripheral region B1 includes a base substrate 30, and a drive circuit layer 35, a first planarization layer 35, a fourth conductive layer, a second planarization layer 37, an encapsulation layer, a protective layer 44, and a touch structure layer that are sequentially disposed on the base substrate 30. The drive circuit layer may include: a semiconductor layer disposed on the base substrate 30, a first insulation layer 31 covering the semiconductor layer, a first conductive layer disposed on the first insulation layer 31, a second insulation layer 32 covering the first conductive layer, a second conductive layer disposed on the second insulation layer 32, a third insulation layer 33 covering the second conductive layer, and a third conductive layer disposed on the third insulation layer 33. In some examples, the first insulation layer 31 to the third insulation layer 33 may be inorganic insulation layers. The first insulation layer 31 and the second insulation layer 32 may be referred to as Gate Insulation layers, and the third insulation layer 33 may be referred to as an interlayer dielectric layer. The protective layer 44 may be an inorganic material layer. The protective layer 44 may be used as a buffer film layer for disposing the touch structure layer.

In some exemplary implementation modes, the third insulation layer 33 is provided with multiple vias that may expose a surface of the semiconductor layer, the first conductive layer, or the second conductive layer, thereby achieving an electrical connection of the third conductive layer with the semiconductor layer, the first conductive layer, or the second conductive layer.

Figure 11:
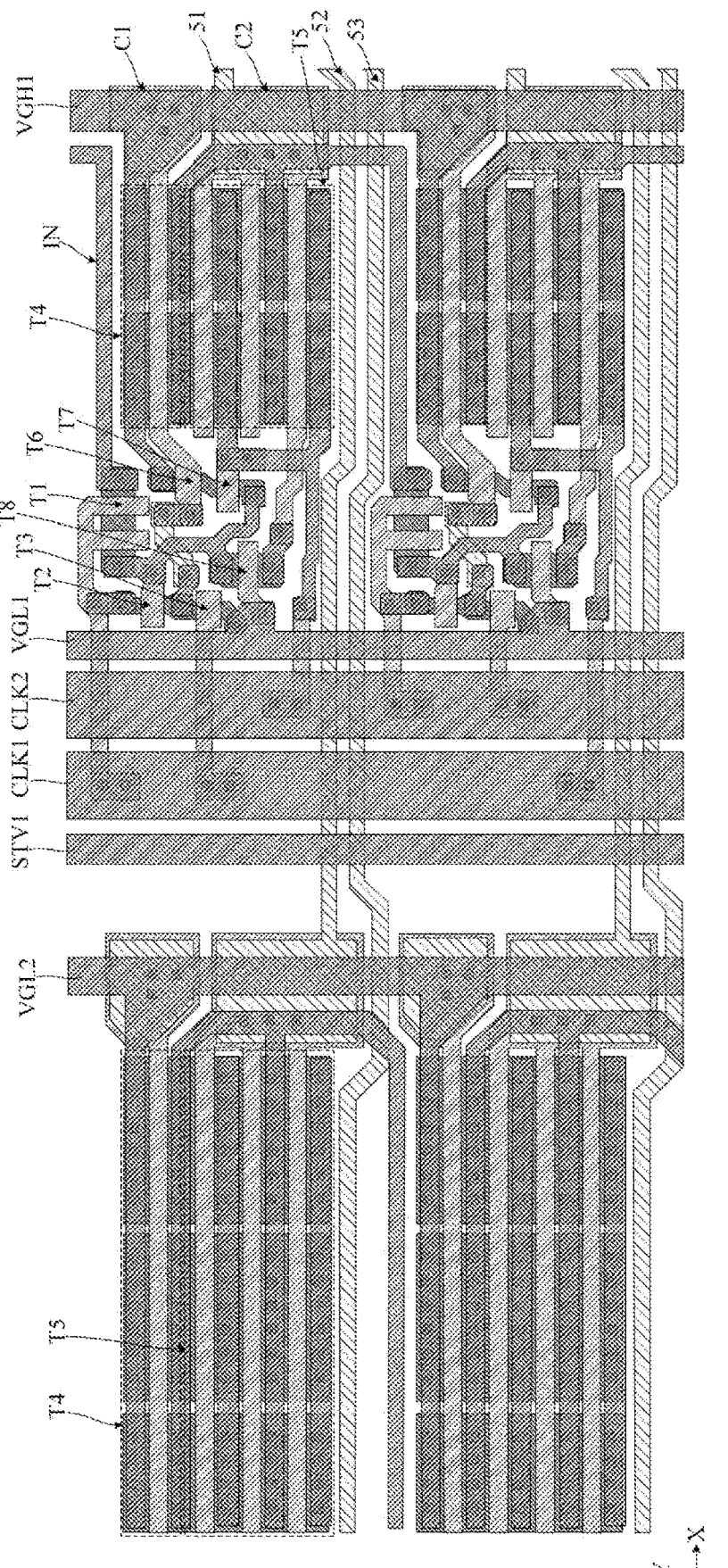
FIG. 11 is a schematic partial plan view of a peripheral region after a drive circuit layer is formed according to at least one implementation of the present disclosure.
Figure 12:
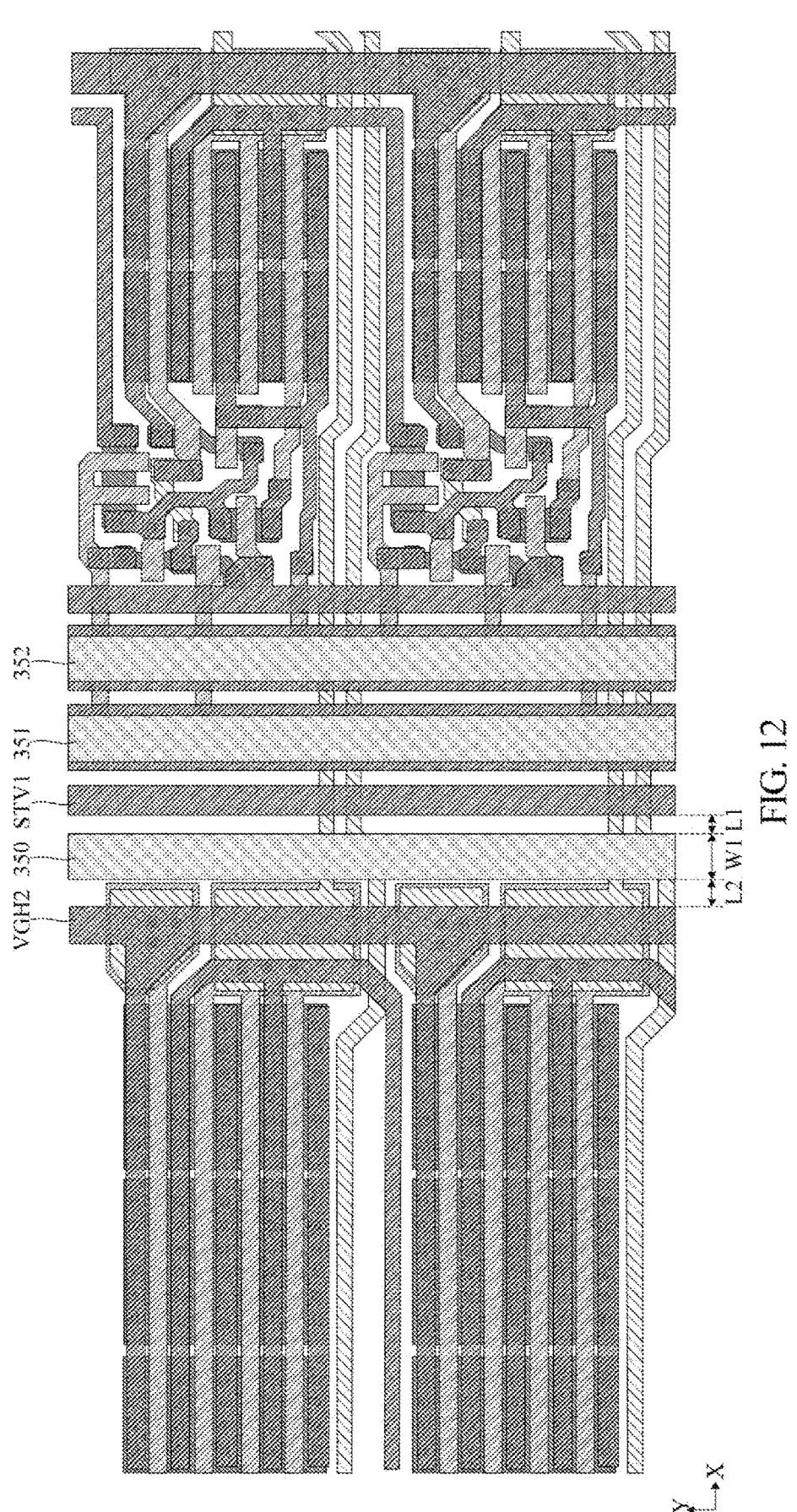
FIG. 12 is a schematic partial plan view of a peripheral region after a first planarization layer is formed according to at least one implementation of the present disclosure.
Figure 13:
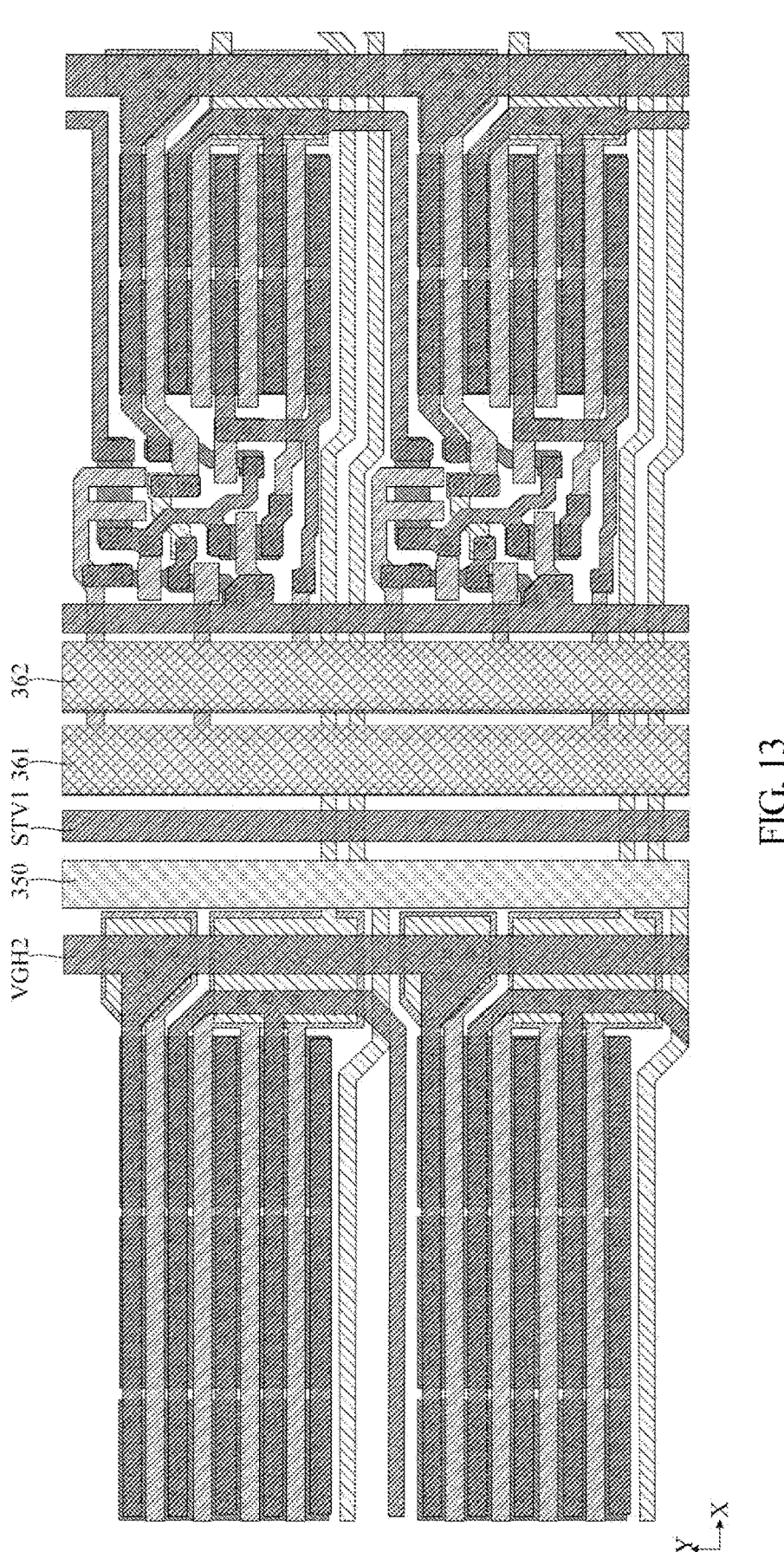
FIG. 13 is a schematic partial plan view of a peripheral region after a fourth conductive layer is formed according to at least one implementation of the present disclosure.
Figure 14:
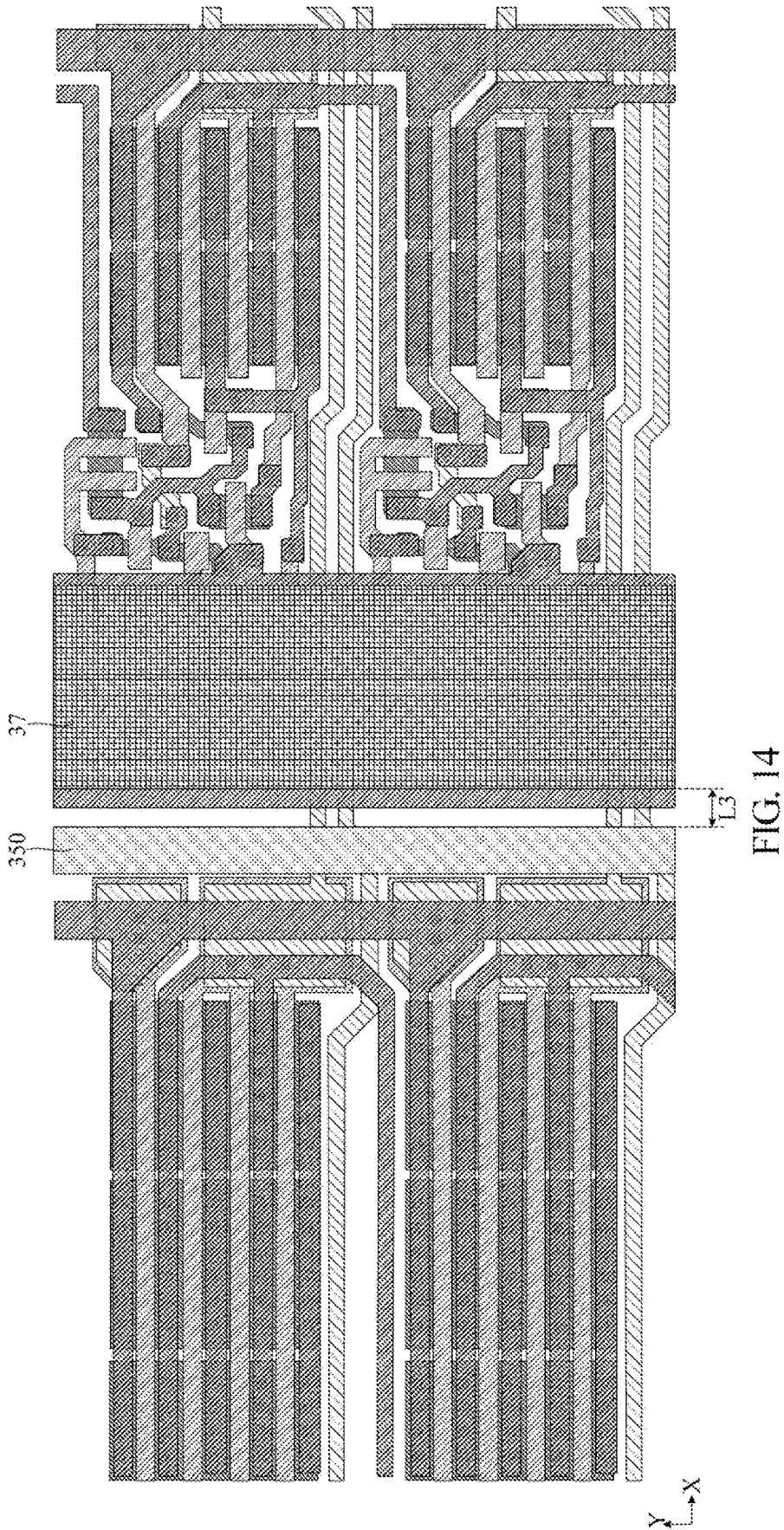
FIG. 14 is a schematic partial plan view of a peripheral region after a second planarization layer is formed according to at least one implementation of the present disclosure.

FIG. 11 is a schematic partial plan view of a peripheral region after a drive circuit layer is formed according to at least one implementation of the present disclosure. FIG. 12 is a schematic partial plan view of a peripheral region after a first planarization layer is formed according to at least one implementation of the present disclosure. FIG. 13 is a schematic partial plan view of a peripheral region after a fourth conductive layer is formed according to at least one implementation of the present disclosure. FIG. 14 is a schematic partial plan view of a peripheral region after a second planarization layer is formed according to at least one implementation of the present disclosure.

In some exemplary implementation modes, as shown in FIGS. 10 and 11, a semiconductor layer of the peripheral region at least includes active layers of multiple transistors of a first sub-drive circuit (e.g., an active layer T20 of a second transistor T2 of the first sub-drive circuit), and active layers of multiple transistors of a second sub-drive circuit. The first conductive layer at least includes: control electrodes of the multiple transistors of the first sub-drive circuit (e.g., a control electrode T23 of the second transistor T2 and a control electrode T33 of a third transistor T3 of the first sub-drive circuit, a first electrode of multiple capacitors, and control electrodes of the multiple transistors of the second sub-drive circuit and a first electrode of a capacitor (for example, a first electrode C1-1 of a first storage capacitor of the second sub-drive circuit). The second conductive layer at least includes second electrodes of multiple capacitors of the first sub-drive circuit and the second sub-drive circuit (for example, a second electrode C1-2 of the first storage capacitor of the second sub-drive circuit), a first output signal line 51, a second output signal line 52, and a third output signal line 53. The first output signal line 51 is electrically connected with an output terminal of the first sub-drive circuit (for example, may be of an integral structure) and extends along a direction of a display region, for example, extends along a first direction X. The second output signal line 52 is electrically connected with an output terminal of the second sub-drive circuit (for example, may be of an integral structure) and extends along the direction of the display region. The third output signal line 53 is electrically connected with an output terminal of the third sub-drive circuit (for example, may be of an integral structure) and extends along the direction of the display region. The third conductive layer at least includes: multiple first signal lines (e.g., a first initial signal line STV1, a first clock signal line CLK1, a second clock signal line CLK2, a first power supply line VGH1, and a second power supply line VGL1) electrically connected with the first sub-drive circuit, multiple second signal lines (e.g., a first power supply line VGH2) electrically connected with the second sub-drive circuit, and multiple third signal lines electrically connected with a third sub-drive circuit.

In some exemplary implementation modes, as shown in FIGS. 9 and 11, the first initial signal line STV1, the first clock signal line CLK1, the second clock signal line CLK2, the second power supply line VGL1, and the first power supply line VGH1 of a first circuit region B11 all extend along a second direction Y. The first initial signal line STV1, the first clock signal line CLK1, the second clock signal line CLK2, and the second power supply line VGL1 are located on a side of the first sub-drive circuit away from the display region and are arranged in sequence along a direction close to the display region. The first power supply line VGH1 is located on a side of the first sub-drive circuit close to the display region.

In some exemplary implementation modes, as shown in FIG. 11, an input terminal of a first sub-drive circuit of a first stage is electrically connected with the first initial signal line STV1, and an input terminal IN of a first sub-drive circuit of an n-th stage and an output terminal of a first sub-drive circuit of an (n−1)-th stage may be of an integral structure. A first clock signal terminal of the first sub-drive circuit of the n-th stage is electrically connected with the first clock signal line CLK1, and a second clock signal terminal is electrically connected with the second clock signal line CLK2. A first clock signal terminal of a first sub-drive circuit of an (n+1)-th stage is electrically connected with the second clock signal line CLK2, and a second clock signal terminal is electrically connected with the first clock signal line CLK1. Herein, n is an integer greater than 1. However, this implementation is not limited thereto.

In some exemplary implementation modes, as shown in FIG. 11, a second transistor T2 and a third transistor T3 of a first sub-drive circuit are close to the second power supply line VGL1 and are sequentially arranged along a second direction Y. An eighth transistor T8 is located between a third transistor T3 and a seventh transistor T7 in a first direction X. A sixth transistor T6 and the seventh transistor T7 are sequentially arranged along the second direction Y. The seventh transistor T7 is located between the eighth transistor T8 and a fifth transistor T5. A fourth transistor T4 and the fifth transistor T5 are sequentially arranged along the second direction Y. A first storage capacitor C1 is located on a side of the fourth transistor T4 close to a display region, and a second storage capacitor C2 is located on a side of the fifth transistor T5 close to the display region.

In some exemplary implementation modes, as shown in FIGS. 9 and 12, a first planarization layer 35 of a peripheral region is provided with a first isolation groove 350, a first groove 351, and a second groove 352. The first isolation groove 350 is located between a first circuit region B11 and a second circuit region B12. The first groove 351 and the second groove 352 are located in the first circuit region B11. The first groove 351 exposes a surface of the first clock signal line CLK1 and the second groove 352 exposes a surface of the second clock signal line CLK2. The first isolation groove 350 is located on a side of the first groove 351 away from the display region. An orthographic projection of the first isolation groove 350 on a base substrate 30 is located on a side of a first initial signal line STV1 of the first circuit region B11 away from the display region, and located on a side of a first storage capacitor and a second storage capacitor of a second sub-drive circuit of the second circuit region B12 close to the display region.

In some exemplary implementation modes, as shown in FIG. 12, the orthographic projection of the first isolation groove 350 on the base substrate has a first width W1. There is a first distance L1 between an edge in the orthographic projection of the first isolation groove 350 on the base substrate 30 close to the display region and an edge in an orthographic projection of the first initial signal line STV1 on the base substrate away from the display region. There is a second distance L2 between an edge in the orthographic projection of the first isolation groove 350 on the base substrate 30 away from the display region and an edge in an orthographic projection of the first power supply line VGH2 electrically connected with a second sub-drive circuit on the base substrate close to the display region. In some examples, the first distance L1 may be less than the second distance L2. In this example, the first width W1 may be about 10 μm. The first distance L1 may be about 3.5 μm to 4.5 μm, for example, may be about 4 μm. The second distance L2 may be about 5.5 μm to 7.2 μm, for example, may be about 6.5 μm. However, this implementation is not limited thereto.

In this exemplary implementation mode, the first planarization layer 35 covers an edge of the first initial signal line STV on a side close to the first isolation groove 350 and a covering width is greater than the first distance (e.g. greater than or equal to 4 μm); the first planarization layer 35 covers an edge of the first power supply line VGH2 on a side close to the first isolation groove 350 and a covering width is greater than the second distance (e.g. greater than or equal to 6.5 μm). In this way, it may be ensured that the first planarization layer 35 covers edges of adjacent signal lines of the first isolation groove 350, thereby effectively avoiding film layer peeling and improving process quality.

In some exemplary implementation modes, as shown in FIG. 12, the orthographic projection of the first isolation groove 350 on the base substrate is not overlapped with an orthographic projection of a first sub-drive circuit or an orthographic projection of a second sub-drive circuit on the base substrate. The orthographic projection of the first isolation groove 350 on the base substrate is overlapped with orthographic projections of a second output signal line 52 and a third output signal line 53 extending along a first direction X on the base substrate. In this example, since the second output signal line 52 and the third output signal line 53 are located in a second conductive layer, which is covered by a third insulation layer 33, the first isolation groove 350 formed in the first planarization layer 35 does not affect signal transmission of the second output signal line 52 and the third output signal line 53 of the second conductive layer.

In some exemplary implementation modes, as shown in FIGS. 10 and 12, a cross-sectional shape of the first isolation groove 350 may be a rectangle or a trapezoid in a direction perpendicular to the display substrate. However, this implementation is not limited thereto.

In some exemplary implementation modes, as shown in FIGS. 9 and 13, a fourth conductive layer is located on a side of the first planarization layer 35 away from the base substrate 30. The fourth conductive layer of the first circuit region B11 of the peripheral region may include a first auxiliary connection line 361 and a second auxiliary connection line 362. The first auxiliary connection line 361 and the second auxiliary connection line 362 extend along the second direction Y and are sequentially arranged along the first direction X. The first auxiliary connection line 361 is electrically connected with the first clock signal line CLK1 through the first groove 351. The second auxiliary connection line 362 is electrically connected with the second clock signal line CLK2 through the second groove 352. An orthographic projection of the first auxiliary connection line 361 on the base substrate may coincide with an orthographic projection of the first clock signal line CLK1 on the base substrate, and an orthographic projection of the second auxiliary connection line 362 on the base substrate may coincide with an orthographic projection of the second clock signal line CLK2 on the base substrate. In this example, the first clock signal line CLK1 and the second clock signal line CLK2 are electrically connected with auxiliary connection lines, so that a double-layer wiring design may be achieved, thereby reducing resistance and improving signal transmission performance. In some examples, the fourth conductive layer of the display region may include: multiple anode connection electrodes configured to electrically connect an anode of a light emitting element and a pixel circuit.

In some exemplary implementation modes, as shown in FIG. 14, a second planarization layer 37 of the first circuit region B11 of the peripheral region covers the first auxiliary connection line 361 and the second auxiliary connection line 362 of the fourth conductive layer, and the second planarization layer 37 at remaining positions is removed. In this example, an orthographic projection of the second planarization layer 37 on the base substrate is not overlapped with the orthographic projection of the first isolation groove 350 on the base substrate. There is a third distance L3 between an edge in the orthographic projection of the second planarization layer 37 of the first circuit region B11 on the base substrate away from the display region and an edge in the orthographic projection of the first isolation groove 350 on the base substrate close to the display region. In some examples, the third distance L3 may be about 9 μm to 11 μm, for example, the third distance L3 may be about 10 μm. However, this implementation is not limited thereto.

In some exemplary implementation modes, as shown in FIG. 9, a touch structure layer of the peripheral region may include multiple touch leads. The multiple touch leads may include multiple first touch leads 461, multiple second touch leads 462, and an isolation lead 463. The multiple touch leads may all extend along the second direction Y and are arranged along the first direction X sequentially. The multiple first touch leads 461 are located on a side of the isolation lead 463 close to the display region, and the multiple second touch leads 462 are located on a side of the isolation lead 463 away from the display region. The isolation lead 463 is configured to shield signal interference between a first touch lead 461 and a second touch lead 462.

In some exemplary implementation modes, the first touch lead 461 may be electrically connected with a first touch electrode of the display region, and the second touch lead 462 may be electrically connected with a second touch electrode of the display region. The first touch electrode may be a receiving electrode and the second touch electrode may be a emitting electrode. However, this implementation is not limited thereto. For example, the first touch lead may be electrically connected with the emitting electrode and the second touch lead may be electrically connected with the receiving electrode.

In some exemplary implementation modes, as shown in FIG. 9, along a direction away from the display region, the isolation lead 463 has a second width W2, the first touch lead 461 has a third width W3, and the second touch lead 462 has a fourth width W4. The second width W2 may be greater than the third width W3 and greater than the fourth width W4. In some examples, the second width W2 may be about 45 μm to 55 μm, for example, may be about 50 μm; the third width W3 may be about 5 μm to 25 μm, for example, may be about 15 μm; the fourth width W4 may be about 10 μm to 15 μm, for example, may be about 10 μm. However, this implementation is not limited thereto.

In some exemplary implementation modes, as shown in FIG. 9, along the direction away from the display region, distances between adjacent first touch leads 461 may be substantially the same. Distances between adjacent second touch leads 462 may be substantially the same. A distance between the isolation lead 463 and an adjacent first touch lead 461 may be approximately equal to a distance between the isolation lead 463 and an adjacent second touch lead 462. The distance between the isolation leads 463 and the adjacent first touch leads 461 is greater than a distance between adjacent first touch leads 461 and also greater than a distance between adjacent second touch leads 462. For example, the distance between the adjacent first touch leads 461 may be about 2 μm to 15 μm, the distance between the adjacent second touch leads 462 may be about 2 μm to 15 μm, the distance between the isolation lead 463 and the adjacent first touch lead 461 may be about 10 μm to 30 μm, and the distance between the isolation lead 463 and the adjacent second touch lead 462 may be about 10 μm to 30 μm.

In some exemplary implementation modes, as shown in FIG. 9, an orthographic projection of a first touch lead 461 on the base substrate 30 may be partially overlapped with the orthographic projection of the first isolation groove 350 on the base substrate 30. However, this implementation is not limited thereto.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition and coating. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B are arranged in a same layer" described in the present disclosure refers to that A and B are formed simultaneously through a same patterning process.

The preparation process of the display substrate according to this exemplary implementation may include following acts.

(1) A Pixel Circuit Layer and a Drive Circuit Layer are Formed on a Base Substrate.

In some exemplary implementation modes, a semiconductor thin film is deposited on a base substrate 30, and the semiconductor thin film is patterned through a patterning process to form a semiconductor layer disposed on the base substrate 30, as shown in FIG. 11. The semiconductor layer at least includes an active layer of a transistor of a pixel circuit located in a display region AA and an active layer of a transistor of a Gate Driver on Array located in a peripheral region B1.

Subsequently, a first insulation thin film and a first conductive thin film are sequentially deposited and the first conductive thin film is patterned through a patterning process to form a first insulation layer 31 covering the semiconductor layer and a first conductive layer disposed on the first insulation layer 31. The first conductive layer at least includes a control electrode of a transistor of a pixel circuit and a first electrode of a storage capacitor located in the display region AA, and a control electrode of a transistor of a Gate Driver on Array and a first electrode of a storage capacitor located in the peripheral region B1. In some examples, the first conductive layer may be referred to as a first gate metal layer.

Subsequently, a second insulation thin film and a second conductive thin film are sequentially deposited and the second conductive thin film is patterned through a patterning process to form a second insulation layer 32 covering the first conductive layer and a second conductive layer disposed on the second insulation layer 32. The second conductive layer at least includes a second electrode of a storage capacitor of a pixel circuit located in the display region AA, a second electrode of a storage capacitor of a Gate Driver on Array located in the peripheral region B1, and multiple output signal lines located in the peripheral region B1 and electrically connected with the Gate Driver on Array. The output signal lines extend toward the display region AA. In some examples, the second conductive layer may be referred to as a second gate metal layer.

Subsequently, a third insulation thin film is deposited, and the third insulation thin film is patterned through a patterning process to form a third insulation layer 33 covering the second conductive layer. The third insulation layer 33 is provided with multiple vias.

In some examples, in this patterning process, multiple cracks arranged at intervals may be formed in a crack dam region, and a groove may be formed in a cutting region. The first insulation layer 31, the second insulation layer 32, and the third insulation layer 33 in the cracks are removed to expose a surface of the base substrate 30; the first insulation layer 31, the second insulation layer 32, and the third insulation layer 33 in the groove are removed to expose the surface of the base substrate 30.

In some examples, two patterning processes may be employed to form the cracks in the crack dam region and the groove in the cutting region. In an exemplary implementation mode, forming a crack dam structure in a concave-convex shape in the crack dam region may avoid affecting film layer structures of a display region and a circuit region during a cutting process. Multiple cracks arranged at intervals can not only reduce stresses on the display region and the circuit region, but also can cut off transmission of cracks in a direction towards the display region and the circuit region.

Subsequently, a third conductive thin film is deposited and is patterned through a patterning process to form a third conductive layer on the third insulation layer 33, as shown in FIG. 11. The third conductive layer at least includes: a first electrode and a second electrode of a transistor of a pixel circuit located in the display region AA, a signal line located in the display region AA and electrically connected with the pixel circuit (e.g., a data line), a first electrode and a second electrode of a transistor of a Gate Driver on Array located in the peripheral region B1, and multiple signal lines (for example, multiple first signal lines, multiple second signal lines, and multiple third signal lines) located in the peripheral region B1 and electrically connected with the Gate Driver on Array. In some examples, the third conductive layer is referred to as a first source drain metal layer.

In an exemplary implementation mode, the first insulation layer 31, the second insulation layer, 32 and the third insulation layer 33 may be made of any one or more of Silicon Oxide (SiOx), Silicon Nitride (SiNx) and Silicon OxyNitride (SiON), and may be a single layer, a multi-layer, or a composite layer. The first insulation layer 31 and the second insulation layer 32 may be referred to as Gate Insulation (GI) layers, and the third insulation layer 33 may be referred to as an Interlayer Dielectric (ILD) layer. The first conductive layer, the second conductive layer, and the third second conductive layer may be made of a metal material, such as any one or more of Argentum (Ag), Copper (Cu), Aluminum (Al), Titanium (Ti), and Molybdenum (Mo), or an alloy material of the above metals, such as an Aluminum Neodymium alloy (AlNd) or a Molybdenum Niobium alloy (MoNb), and may be of a single-layer structure, or a multi-layer composite structure, such as Ti/Al/Ti. The semiconductor layer may be made of various materials, such as amorphous Indium Gallium Zinc Oxide (a-IGZO), Zinc Oxynitride (ZnON), Indium Zinc Tin Oxide (IZTO), amorphous Silicon (a-Si), polycrystalline Silicon (p-Si), hexathiophene, and polythiophene. That is, the present disclosure is applicable to a transistor manufactured based on an oxide technology, a silicon technology, and an organic matter technology.

In some exemplary implementation modes, the base substrate 30 may be a rigid base substrate, or may be a flexible base substrate. For example, the rigid base substrate may be made of a material such as glass or quartz, the flexible base substrate may be made of a material such as Polyimide (PI), the flexible base substrate may be of a single-layer structure, or may be a laminated structure composed of an inorganic material layer and a flexible material layer, and the present disclosure is not limited herein.

(2) A First Planarization Layer is Formed.

In some exemplary implementation modes, a planarization thin film is coated on the base substrate 30 formed with the aforementioned pattern, and the planarization thin film is patterned through a patterning process to form a first planarization layer 35 covering the third conductive layer, as shown in FIG. 12. The first planarization layer 35 is formed with a first isolation groove 350 in the peripheral region B1.

In some examples, the first planarization thin film in the first isolation groove 350 is removed to expose a surface of the third insulation layer 33. The first isolation groove 350 is configured to exclude water vapor generated in a patterning process of the first planarization layer, so as to prevent the water vapor from entering the display region to cause defects such as pixel failure, metal bulging, or film layer peeling, and improve process quality.

In some examples, the first planarization layer 35 may be made of an organic material, such as resin. A thickness of the first planarization layer 35 may be about 1.5 μm to 3.5 μm.

(3) A Fourth Conductive Layer is Formed.

In some exemplary implementation modes, a fourth conductive thin film is deposited on the base substrate 30 on which the aforementioned patterns are formed, and a fourth conductive layer is formed through a patterning process, as shown in FIG. 13. The fourth conductive layer includes an anode connection electrode located in the display region AA and an auxiliary connection line located in the peripheral region B1. The anode connection electrode is configured to connect a pixel circuit and an anode of a light emitting element.

(4) A Second Planarization Layer is Formed.

In some exemplary implementation modes, a second planarization thin film is coated on the base substrate 30 formed with the aforementioned patterns, and the second planarization thin film is patterned through a patterning process to form a second planarization layer 37 covering the fourth conductive layer, as shown in FIG. 14. In this example, only the second planarization layer 37 covering the fourth conductive layer may be remained within the peripheral region. However, this implementation is not limited thereto.

In subsequent processes, an anode, a pixel definition layer, an organic emitting layer, and a cathode are sequentially formed in the display region AA. Subsequently, an encapsulation layer is formed. The encapsulation layer includes a first inorganic encapsulation layer, an organic encapsulation layer, and a second inorganic encapsulation layer that are stacked. Subsequently, a protective layer and a touch structure layer disposed on the protective layer are formed.

In this example, the first isolation groove 350 of the first planarization layer 35 is located on a side of a second circuit region close to the display region. A first connection electrode 251, a cathode 213, a first inorganic encapsulation layer 41, and an organic encapsulation layer 42 are sequentially disposed in the first isolation groove 350. The first connection electrode 251 and the anode 211 are of a same layer structure. The organic encapsulation layer 42 here has a thickness sufficient to fill up a film layer height section difference generated by the first isolation groove 350, so that surfaces of the encapsulation layer and the protective layer 44 on a side away from the base substrate 30 are both flat surfaces. A touch structure layer is formed on a flat surface, which may avoid a risk of short circuit of touch leads caused by residual glue during a preparation process.

The preparation process of the display substrate in the exemplary implementation of the present disclosure has good process compatibility, simple process achievement, easy implementation, a high production efficiency, a low production cost, and a high yield.

The description of the structure and preparation process of the display substrate according to the present disclosure is merely illustrative. In an exemplary implementation mode, a corresponding structure may be changed and a patterning process may be increased or decreased according to actual needs, which is not limited in the present disclosure.

Figure 15:
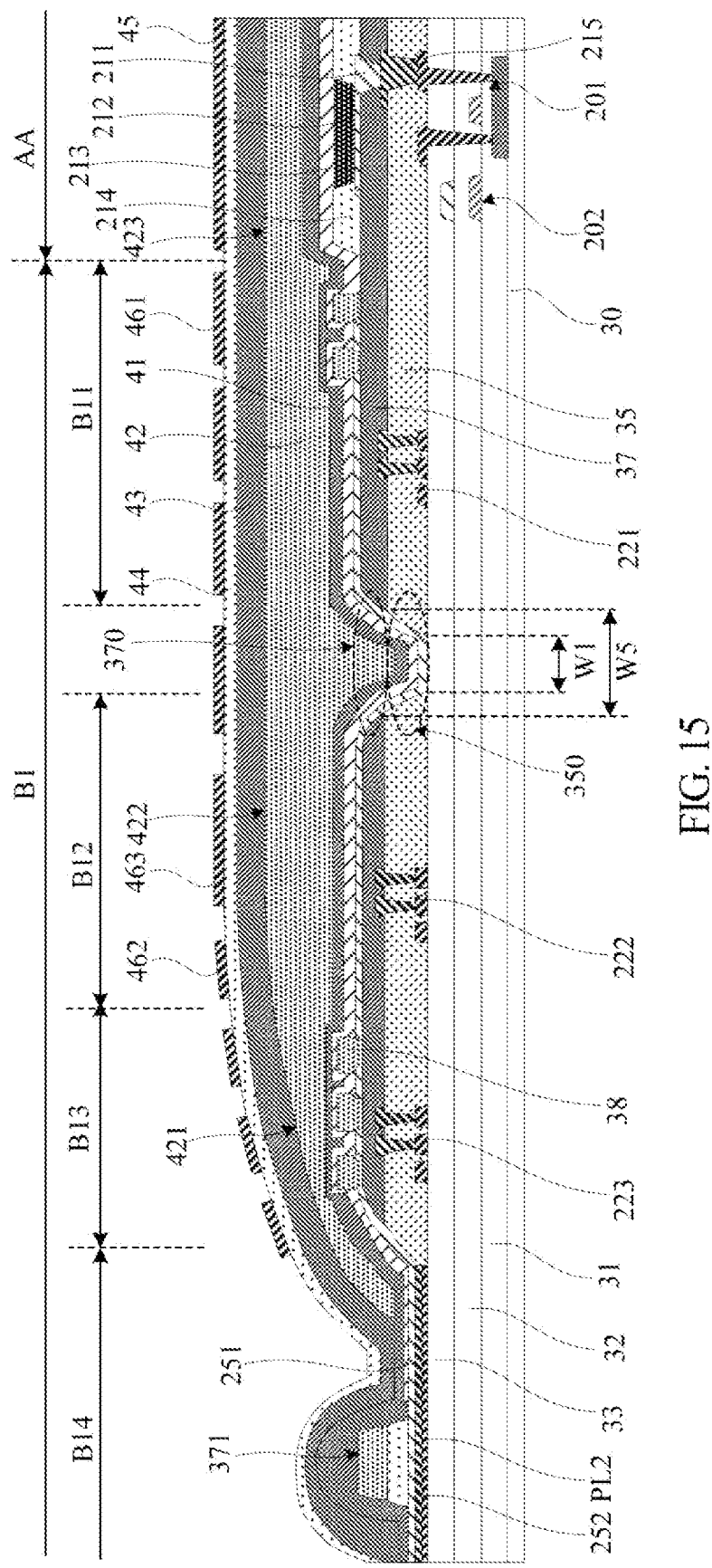
FIG. 15 is another partial cross-sectional schematic diagram along the P-P' direction in FIG. 2.
Figure 16:
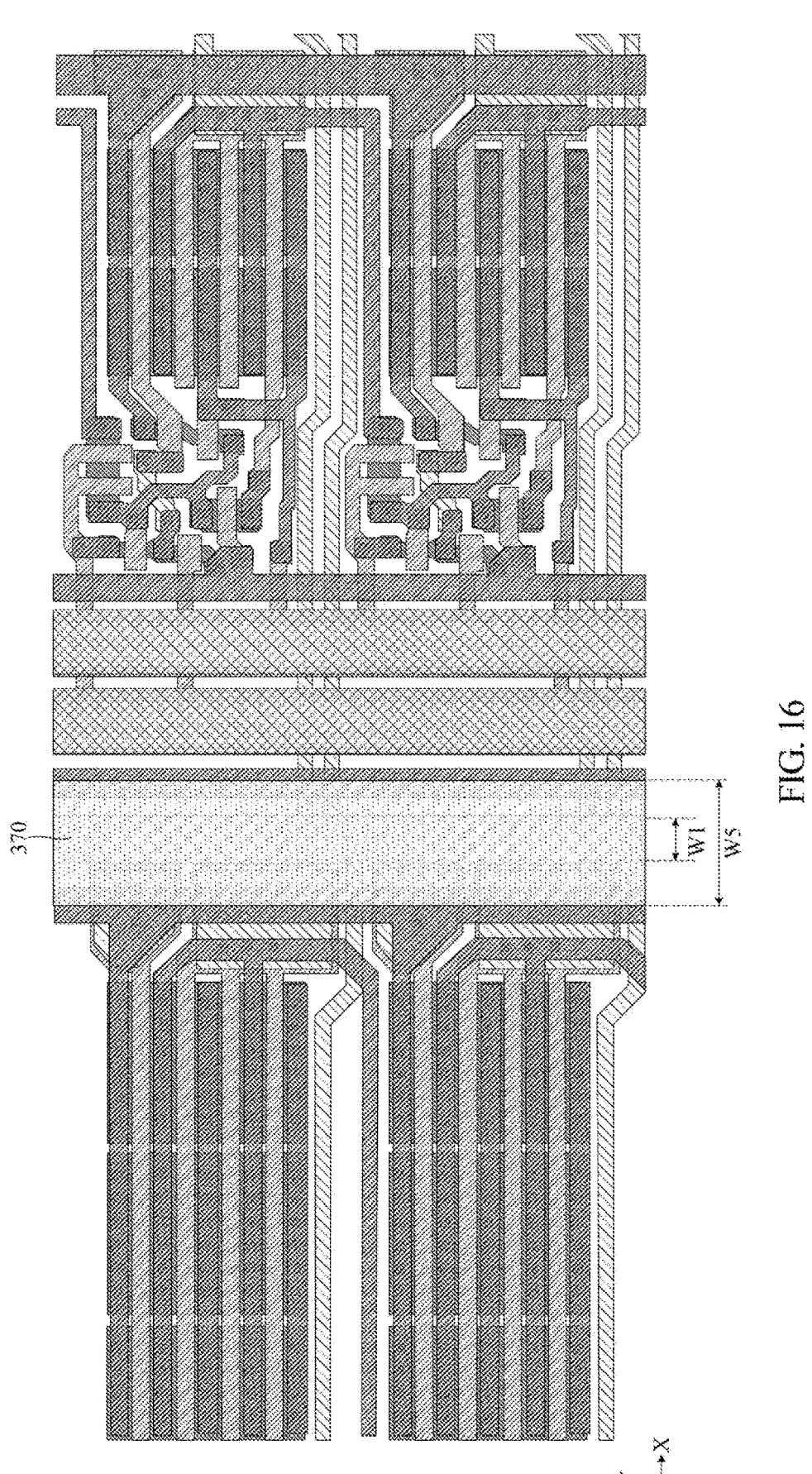
FIG. 16 is another schematic partial plan view of a peripheral region after a second planarization layer is formed according to at least one implementation of the present disclosure.

FIG. 15 is another partial cross-sectional schematic diagram along the P-P' direction in FIG. 2. FIG. 16 is another schematic partial plan view of a peripheral region after a second planarization layer is formed according to at least one implementation of the present disclosure.

In some exemplary implementation modes, as shown in FIGS. 15 and 16, a fourth conductive layer and a second planarization layer 37 are sequentially disposed on a side of a first planarization layer 35 away from a base substrate 30. The fourth conductive layer of a display region AA may include an anode connection electrode 215 which may electrically connect a pixel circuit and an anode 211 of a light emitting element. The fourth conductive layer of a peripheral region B1 may include multiple auxiliary connection lines and a second connection electrode 252. An auxiliary connection line may be electrically connected with a signal line of a third conductive layer. The second connection electrode 252 may be electrically connected with a second voltage line PL2 of the third conductive layer and may also be electrically connected with a first connection electrode 251. The first connection electrode 251 and the anode 211 are of a same layer structure. The cathode 213 may be electrically connected with the second voltage line PL2 through the first connection electrode 251 and the second connection electrode 252.

In some exemplary implementation modes, as shown in FIGS. 15 and 16, the first planarization layer 35 has a first isolation groove 350 in the peripheral region B1. The second planarization layer 37 has a second isolation groove 370 in the peripheral region B1. The first isolation groove 350 and the second isolation groove 370 are located between a first circuit region B11 and a second circuit region B12. An orthographic projection of the second isolation groove 370 on the base substrate 30 may cover an orthographic projection of the first isolation groove 350 on the base substrate 30. However, this implementation is not limited thereto. For example, the orthographic projection of the second isolation groove on the base substrate may be partially overlapped with the orthographic projection of the first isolation groove on the base substrate.

In some exemplary implementation modes, as shown in FIGS. 15 and 16, along a direction away from the display region, the first isolation groove 350 has a first width W1 and the second isolation groove 370 has a fifth width W5. The fifth width W5 may be greater than the first width W1. For example, the first width W1 may be about 10 μm, and the fifth width W5 may be about 27 μm to 33 μm, for example, may be about 30 μm. However, this implementation is not limited thereto.

In some exemplary implementation modes, a thickness of the second planarization layer 37 may be about 1 μm to 3 μm, for example, may be about 2 μm. A depth of the second isolation groove 370 and the thickness of the second planarization layer 37 may be substantially the same. The second planarization layer 37 within the second isolation groove 370 is completely removed and the second isolation groove 370 may be communicated with the first isolation groove 350. As shown in FIG. 15, the first connection electrode 251, the cathode 213, the first inorganic encapsulation layer 41, and the organic encapsulation layer 42 may be disposed in the first isolation groove 350 and the second isolation groove 370 in sequence.

In this exemplary implementation mode, the first isolation groove 350 and the second isolation groove 370 are configured to exclude water vapor generated in patterning processes of the first planarization layer 35 and the second planarization layer 37, so as to avoid defects such as pixel failure, metal bulging, or film layer peeling caused by water vapor entering the display region AA, and improve process quality. In this example, a water vapor discharge effect may be further improved by setting two isolation grooves.

In some examples, as shown in FIG. 15, a first isolation dam 371 is formed by laminating a first dam foundation and a second dam foundation. The first dam foundation may be of a same layer structure as a pixel definition layer 214 and the second dam foundation may be of a same layer structure as an isolation pillar layer 38. However, this implementation is not limited thereto.

Rest of the structure of the display substrate according to this implementation may be referred to descriptions of the aforementioned implementations, and will not be repeated here.

Figure 17:
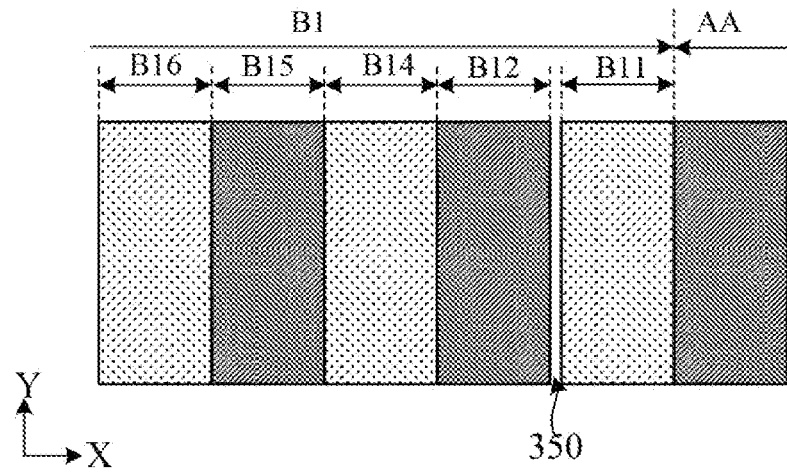
FIG. 17 is another schematic diagram of a planar structure of a peripheral region of a display substrate according to at least one implementation of the present disclosure.

FIG. 17 is another schematic diagram of a planar structure of a peripheral region of a display substrate according to at least one implementation of the present disclosure. In some exemplary implementation modes, in a plane parallel to the display substrate, a peripheral region B1 may include multiple circuit regions (e.g., a first circuit region B11 and a second circuit region B12), an isolation region B14, a crack dam region B15, and a cutting region B16 arranged in sequence along a direction away from a display region AA. The first isolation groove 350 is located between the first circuit region B11 and the second circuit region B12. The first circuit region B11 may include a first drive circuit and multiple first signal lines that output control signals (e.g. a clock signal, an initial signal, and a power supply signal) to the first drive circuit. The first drive circuit is configured to output a first drive signal to a pixel circuit of the display region AA. The second circuit region B12 may include a second drive circuit and multiple second signal lines outputting control signals to the second drive circuit region. The second drive circuit is configured to output a second drive signal to the pixel circuit of the display region AA.

In some exemplary implementation modes, the first drive signal may be a scan signal and the second drive signal may be a light emitting control signal. However, this implementation is not limited thereto. For example, the first drive signal may be a light emitting control signal and the second drive signal may be a scan signal.

Figure 18:
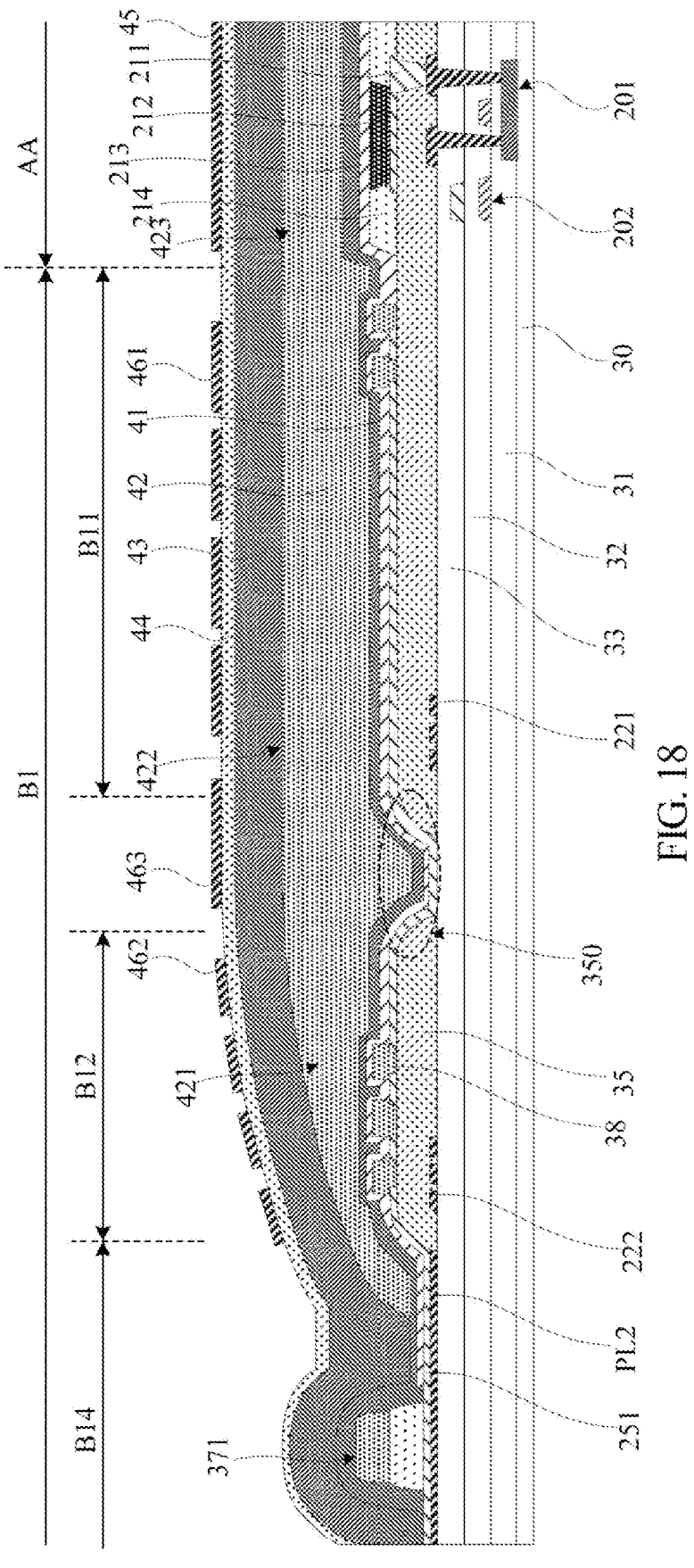
FIG. 18 is another partial cross-sectional schematic diagram along the P-P' direction in FIG. 2.

FIG. 18 is another partial cross-sectional schematic diagram along the P-P' direction in FIG. 2. In some exemplary implementation modes, as shown in FIG. 18, in a direction perpendicular to a display substrate, a display region AA may include: a base substrate 30, and a pixel circuit layer, a first planarization layer 35, a light emitting structure layer, an encapsulation layer, a protective layer 44, and a touch structure layer that are sequentially disposed on the base substrate 30. The touch structure layer of the display region AA at least includes multiple touch electrodes 45. A peripheral region B1 may include the base substrate 30, and a drive circuit layer, the first planarization layer 35, the encapsulation layer, the protective layer 44, and the touch structure layer that are sequentially disposed on the base substrate 30. The touch structure layer of the peripheral region B1 at least includes multiple first touch leads 461, multiple second touch leads 462, and an isolation lead 463.

In some exemplary implementation modes, as shown in FIG. 18, the first planarization layer 35 has a first isolation groove 350 in the peripheral region. The first isolation groove 350 is located between a first circuit region B11 and a second circuit region B12. Orthographic projections of a first portion 421 and a second portion 422 of an organic encapsulation layer 42 on the base substrate 30 are both overlapped with an orthographic projection of the first isolation groove 350 on the base substrate 30. That is, the orthographic projection of the first isolation groove 350 on the base substrate 30 may be located at a junction of the first portion 421 and the second portion 422 of the organic encapsulation layer 42.

In some exemplary implementation modes, as shown in FIG. 18, an orthographic projection of the isolation lead 463 of the touch structure layer on the base substrate 30 is overlapped with the orthographic projection of the first isolation groove 350 on the base substrate 30. For example, the orthographic projection of the isolation lead 463 on the base substrate 30 may cover the orthographic projection of the isolation groove 350 on the base substrate 30. However, this implementation is not limited thereto.

Rest of the structure of the display substrate according to this implementation may be referred to descriptions of the aforementioned implementations, and will not be repeated here.

Figure 19:
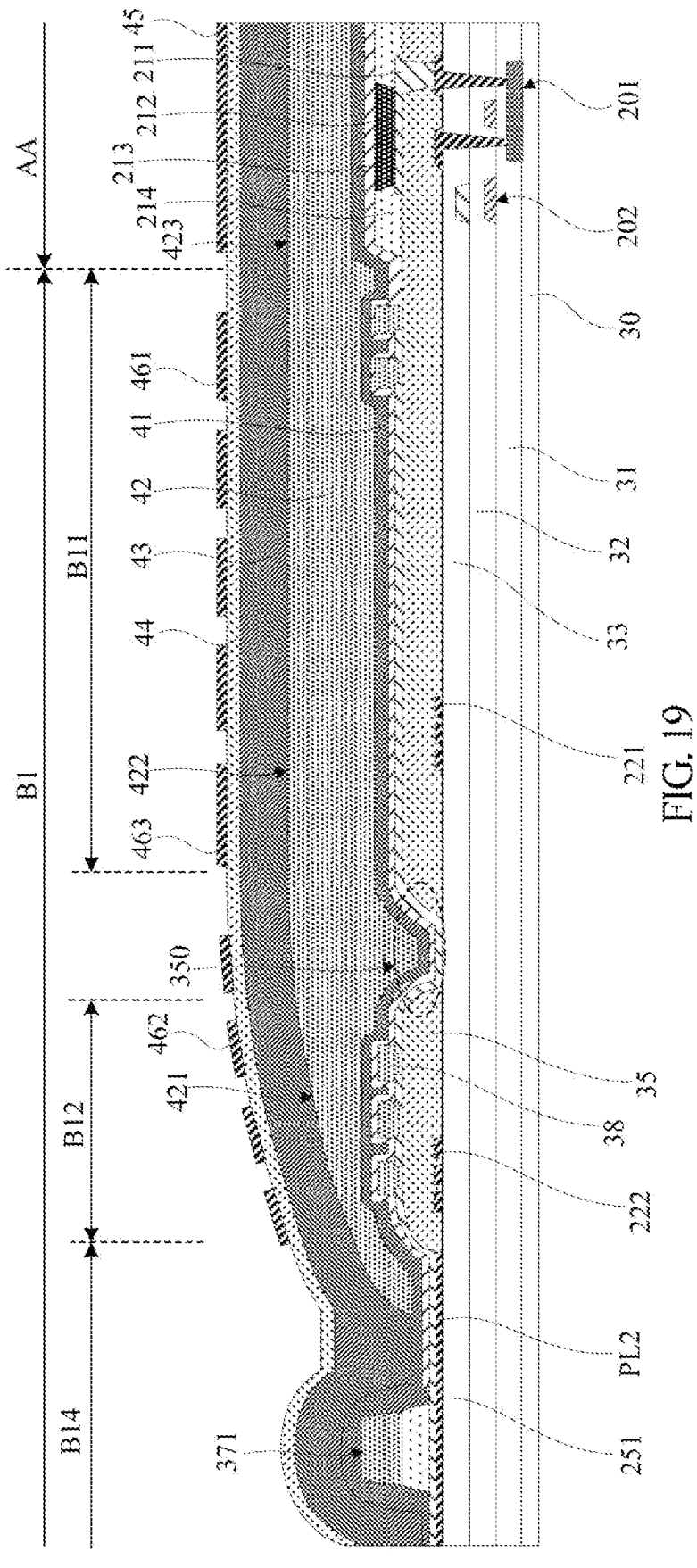
FIG. 19 is another partial cross-sectional schematic diagram along the P-P' direction in FIG. 2.

FIG. 19 is another partial cross-sectional schematic diagram along the P-P' direction in FIG. 2. In some exemplary implementation modes, as shown in FIG. 19, the orthographic projection of the first portion 421 of the organic encapsulation layer 42 on the base substrate 30 covers the orthographic projection of the first isolation groove 350 on the base substrate 30. That is, a height of a climbing region of the organic encapsulation layer 42 may fill up a film layer height section difference due to the first isolation groove 350 and a surface of the climbing region may be kept flat. In some examples, a first height of the organic encapsulation layer 42 may be from about 28 μm to 42 μm, for example, about 35 μm. A second height may be about 20 μm to 30 μm.

In some exemplary implementation modes, as shown in FIG. 19, an orthographic projection of a second touch lead 462 of the touch structure layer on the base substrate 30 may be overlapped with the orthographic projection of the first isolation groove 350 on the base substrate 30. However, this implementation is not limited thereto.

Rest of the structure of the display substrate according to this implementation may be referred to descriptions of the aforementioned implementations, and will not be repeated here.

Figure 20:
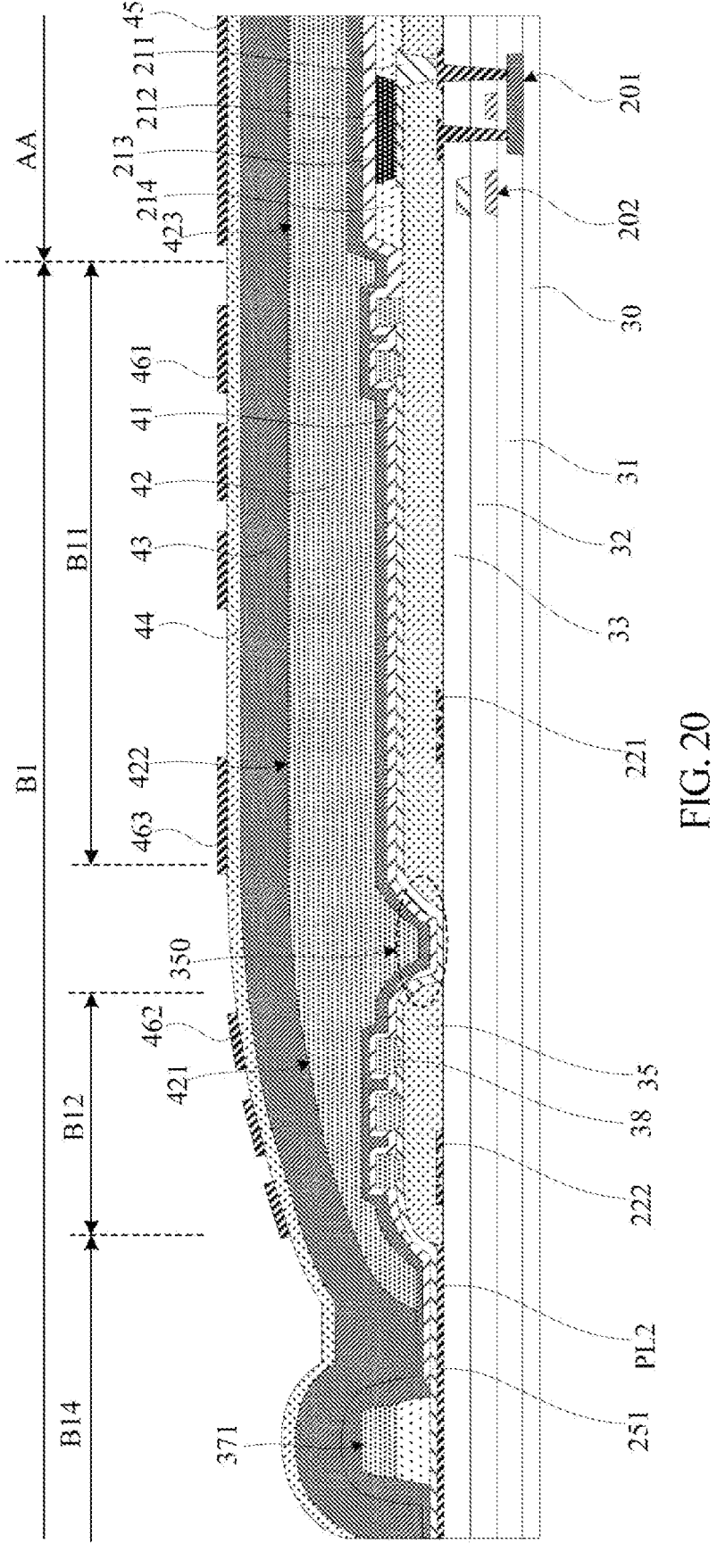
FIG. 20 is another partial cross-sectional schematic diagram along the P-P' direction in FIG. 2.

FIG. 20 is another partial cross-sectional schematic diagram along the P-P' direction in FIG. 2. In some exemplary implementation modes, as shown in FIG. 20, an orthographic projection of a touch lead of the touch structure layer on the base substrate 30 may not be overlapped with the orthographic projection of the first isolation groove 350 on the base substrate 30. For example, the orthographic projection of the first isolation groove 350 on the base substrate 30 may be located between orthographic projections of a second touch lead 462 and the shield lead 463 on the base substrate 30, and is not overlapped with the orthographic projections of the second touch lead 462 and the shield lead 463 on the base substrate 30. However, this implementation is not limited thereto. For example, the orthographic projection of the first isolation groove on the base substrate may be located between orthographic projections of a first touch lead and the shield lead on the base substrate, and is not overlapped with the orthographic projections of the first touch lead and the shield lead on the base substrate.

Rest of the structure of the display substrate according to this implementation may be referred to descriptions of the aforementioned implementations, and will not be repeated here.

In other exemplary implementation modes, an orthographic projection of the second portion of the organic encapsulation layer on the base substrate covers the orthographic projection of the first isolation groove on the base substrate, and an orthographic projection of the shield lead of the touch structure layer on the base substrate may be overlapped with the orthographic projection of the first isolation groove on the base substrate, or an orthographic projection of the second touch lead of the touch structure layer on the base substrate may be overlapped with the orthographic projection of the first isolation groove on the base substrate. Or, in other exemplary implementation modes, an orthographic projection of the first portion of the organic encapsulation layer on the base substrate may cover the orthographic projection of the first isolation groove on the base substrate, and the orthographic projection of the shield lead of the touch structure layer on the base substrate may be overlapped with the orthographic projection of the first isolation groove on the base substrate. However, this implementation is not limited thereto.

Figure 21:
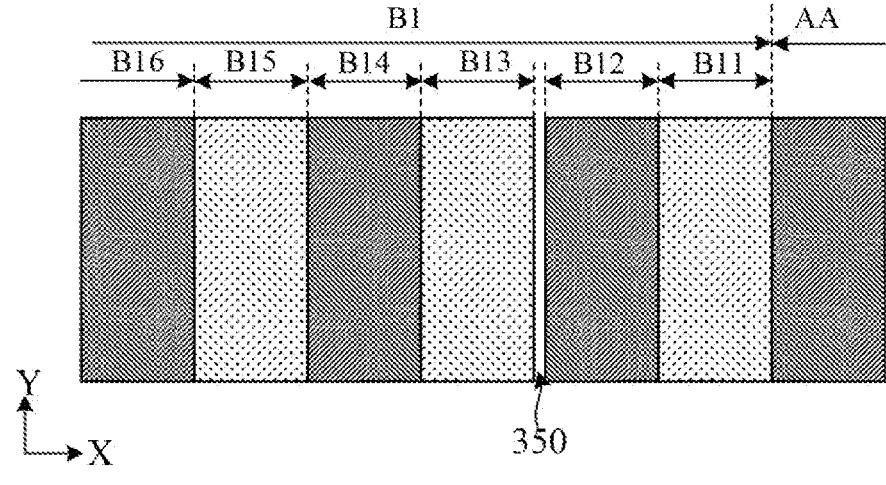
FIG. 21 is another schematic diagram of a planar structure of a peripheral region of a display substrate according to at least one implementation of the present disclosure.
Figure 22:
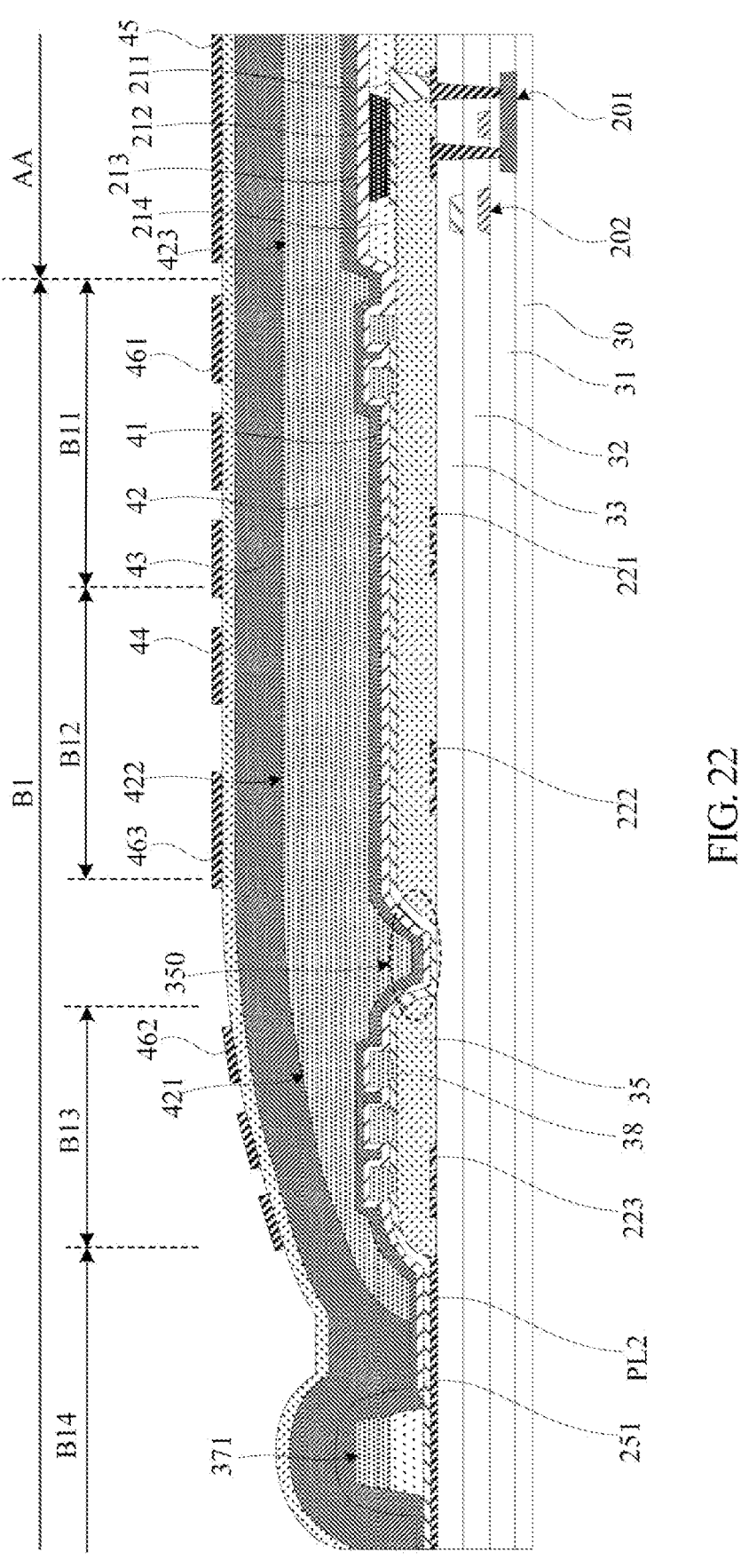
FIG. 22 is another partial cross-sectional schematic diagram along the P-P' direction in FIG. 2.

FIG. 21 is another schematic diagram of a planar structure of a peripheral region of a display substrate according to at least one implementation of the present disclosure. FIG. 22 is another partial cross-sectional schematic diagram along the P-P' direction in FIG. 2. In some exemplary implementation modes, as shown in FIGS. 21 and 22, in a plane parallel to the display substrate, a peripheral region B1 may include multiple circuit regions (e.g., a first circuit region B11, a second circuit region B12, and a third circuit region B13), an isolation region B14, a crack dam region B15, and a cutting region B16 arranged in sequence along a direction away from a display region AA. A first planarization layer 25 has a first isolation groove 350 in the peripheral region. The first isolation groove 350 is located between the second circuit region B12 and the third circuit region B13.

In some examples, orthographic projections of a first portion 421 and a second portion 422 of an organic encapsulation layer 42 on a base substrate 30 are both overlapped with an orthographic projection of the first isolation groove 350 on the base substrate 30. That is, the orthographic projection of the first isolation groove 350 on the base substrate 30 may be located at a junction of the first portion 421 and the second portion 422 of the organic encapsulation layer 42. However, this implementation is not limited thereto.

Rest of the structure of the display substrate according to this implementation may be referred to descriptions of the aforementioned implementations, and will not be repeated here.

An implementation of the present disclosure further provides a preparation method of a display substrate. The display substrate includes a display region and a peripheral region at least partially surrounding the display region. The preparation method of the implementation includes: forming a drive circuit layer in the peripheral region of a base substrate; forming a first planarization layer on a side of the drive circuit layer away from the base substrate, wherein the first planarization layer has a first isolation groove in the peripheral region; and forming an organic encapsulation layer on a side of the first planarization layer away from the base substrate. The organic encapsulation layer includes a first portion and a second portion located in the peripheral region, and the second portion is located on a side of the first portion close to the display region. The second portion has a first height, and a height of the first portion gradually decreases from the first height to a second height along a direction away from the display region. The first height is greater than the second height. Among them, the first isolation groove is located on a side of the first portion close to the display region, and an orthographic projection of at least one of the first portion and the second portion of the organic encapsulation layer on the base substrate covers an orthographic projection of the first isolation groove on the base substrate.

The preparation method of this implementation may refer to the descriptions in the above-mentioned implementations, and thus will not be repeated herein.

At least one implementation of the present disclosure further provides a display apparatus which includes the display substrate as described above.

Figure 23:
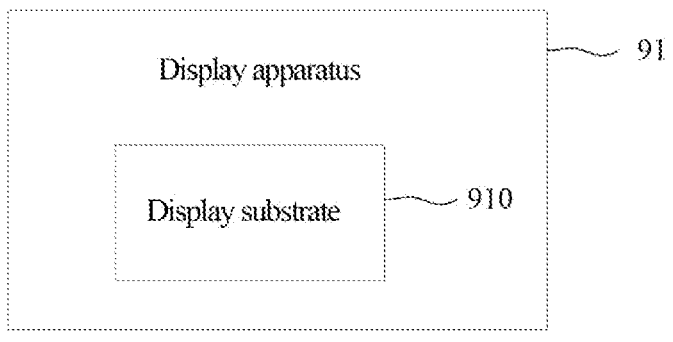
FIG. 23 is a schematic diagram of a display apparatus according to at least one implementation of the present disclosure.

FIG. 23 is a schematic diagram of a display apparatus according to at least one implementation of the present disclosure. As shown in FIG. 23, a display apparatus 91 according to this implementation includes a display substrate 910. In some examples, the display substrate 910 may be a flexible OLED display substrate, a QLED display substrate, a Micro-LED display substrate, or a Mini-LED display substrate. The display apparatus may be any product or component with a display function such as an OLED display, a mobile phone, a tablet computer, a television, a display, a laptop, a digital photo frame, and a navigator, which is not limited in the implementation of the present disclosure.

The drawings of the present disclosure only involve structures involved in the present disclosure, and other structures may refer to conventional designs. The implementations in the present disclosure, i.e., features in the implementations, may be combined with each other to obtain new implementations if there is no conflict.

Those of ordinary skills in the art should understand that modifications or equivalent replacements may be made to the technical solutions of the present disclosure without departing from the spirit and scope of the technical solutions of the present disclosure, and shall all fall within the scope of the claims of the present disclosure.

The invention claimed is:

1. A display substrate, comprising:
a base substrate, and a drive circuit layer, a first planarization layer, and an organic encapsulation layer disposed on the base substrate sequentially;
the base substrate comprising a display region and a peripheral region at least partially surrounding the display region;
the drive circuit layer located in the peripheral region;
the first planarization layer having a first isolation groove in the peripheral region;
the organic encapsulation layer comprising a first portion and a second portion located in the peripheral region; the second portion located on a side of the first portion close to the display region; the second portion having a first height, a height of the first portion gradually decreasing from the first height to a second height along a direction away from the display region; the first height being greater than the second height;
the first isolation groove located on a side of the first portion close to the display region, and an orthographic projection of at least one of the first portion and the second portion of the organic encapsulation layer on the base substrate covering an orthographic projection of the first isolation groove on the base substrate,
wherein the peripheral region comprises multiple circuit regions sequentially arranged along the direction away from the display region, and the first isolation groove is located between two adjacent circuit regions.

2. The display substrate according to claim 1, wherein the display substrate further comprises: a second planarization layer located on a side of the first planarization layer away from the base substrate; the second planarization layer having a second isolation groove in the peripheral region, an orthographic projection of the second isolation groove on the base substrate being at least partially overlapped with the orthographic projection of the first isolation groove on the base substrate.

3. The display substrate according to claim 2, wherein the orthographic projection of the second isolation groove on the base substrate contains the orthographic projection of the first isolation groove on the base substrate.

4. The display substrate according to claim 1, wherein in the peripheral region, the first isolation groove extends along a direction parallel to an edge of the display region.

5. The display substrate according to claim 1, wherein the first isolation groove has a first width along the direction away from the display region, and the first width is 4 microns to 15 microns;
in a direction perpendicular to the base substrate, the first isolation groove has a first depth, and the first depth is 1.5 microns to 3.5 microns.

6. The display substrate according to claim 1, wherein the multiple circuit regions of the peripheral region comprise: a first circuit region, a second circuit region, and a third circuit region sequentially arranged along the direction away from the display region, or a first circuit region and a second circuit region sequentially arranged along the direction away from the display region;
the first isolation groove is located between the first circuit region and the second circuit region.

7. The display substrate according to claim 1, wherein the multiple circuit regions of the peripheral region at least comprise: a first circuit region, a second circuit region, and a third circuit region arranged sequentially along the direction away from the display region; the first isolation groove is located between the second circuit region and the third circuit region.

8. The display substrate according to claim 6, wherein the first circuit region is provided with a first drive circuit and multiple first signal lines for supplying control signals to the first drive circuit, and the second circuit region is provided with a second drive circuit and multiple second signal lines for supplying control signals to the second drive circuit;

the orthographic projection of the first isolation groove on the base substrate is located between the first signal lines and the second drive circuit.

9. The display substrate according to claim 8, wherein the multiple first signal lines at least comprise: a first initial signal line providing a first initial signal to the first drive circuit; the multiple second signal lines at least comprise: a first power supply line providing a first voltage signal to the second drive circuit;

there is a first distance between an edge in the orthographic projection of the first isolation groove on the base substrate close to the display region and an edge in an orthographic projection of the first initial signal line on the base substrate away from the display region, and there is a second distance between an edge in the orthographic projection of the first isolation groove on the base substrate away from the display region and an edge in an orthographic projection of the first power supply line on the base substrate close to the display region;

the first distance is less than the second distance.

10. The display substrate according to claim 9, wherein the first distance is 3.5 microns to 4.5 microns, and the second distance is 5.5 microns to 7.2 microns.

11. The display substrate according to claim 8, wherein the first drive circuit is electrically connected with multiple first output signal lines and the second drive circuit is electrically connected with multiple second output signal lines; the third circuit region is provided with a third drive circuit, which is electrically connected with multiple third output signal lines; the first output signal lines, the second output signal lines, and the third output signal lines extend toward a direction of the display region;

the orthographic projection of the first isolation groove on the base substrate is overlapped with orthographic projections of the multiple second output signal lines and the multiple third output signal lines on the base substrate.

12. The display substrate according to claim 11, wherein the display region is provided with multiple pixel circuits;

the first drive circuit is configured to provide a reset control signal to multiple pixel circuits of the display region through the first output signal lines;

the second drive circuit is configured to provide a scan signal to multiple pixel circuits of the display region through the second output signal lines;

the third drive circuit is configured to provide a light emitting control signal to multiple pixel circuits of the display region through the third output signal lines.

13. The display substrate according to claim 1, wherein the display substrate further comprises: a first inorganic encapsulation layer located on a side of the organic encapsulation layer close to the base substrate, a second inorganic encapsulation layer located on a side of the organic encapsulation layer away from the base substrate, and a touch structure layer located on a side of the second inorganic encapsulation layer away from the base substrate;

the touch structure layer comprises multiple touch leads in the peripheral region;

the orthographic projection of the first isolation groove on the base substrate is not overlapped with an orthographic projection of a touch lead on the base substrate, or the orthographic projection of the first isolation groove on the base substrate is overlapped with an orthographic projection of at least one touch lead on the base substrate.

14. The display substrate according to claim 13, wherein the multiple touch leads comprise: multiple first touch leads, an isolation lead, and multiple second touch leads arranged in sequence along the direction away from the display region;

along the direction away from the display region, the isolation lead has a second width, a first touch lead has a third width, and a second touch lead has a fourth width;

the second width is greater than the third width and greater than the fourth width.

15. The display substrate according to claim 1, wherein a width of the first portion of the organic encapsulation layer is 500 microns to 1000 microns along the direction away from the display region.

16. The display substrate according to claim 1, wherein the first height is 28 microns to 42 microns.

17. The display substrate according to claim 1, wherein the second height is 20 microns to 30 microns.

18. A display apparatus, comprising the display substrate according to claim 1.

19. A preparation method of a display substrate, wherein the display substrate comprises a display region and a peripheral region at least partially surrounding the display region; the preparation method comprises:

forming a drive circuit layer in the peripheral region of the a base substrate;

forming a first planarization layer on a side of the drive circuit layer away from the base substrate, wherein the first planarization layer has a first isolation groove in the peripheral region;

forming an organic encapsulation layer on a side of the first planarization layer away from the base substrate, wherein the organic encapsulation layer comprises a first portion and a second portion located in the peripheral region, the second portion is located on a side of the first portion close to the display region; the second portion has a first height, a height of the first portion gradually decreases from the first height to a second height along a direction away from the display region; the first height is greater than the second height;

wherein the first isolation groove is located on a side of the first portion close to the display region, and an orthographic projection of at least one of the first portion and the second portion of the organic encapsulation layer on the base substrate covers an orthographic projection of the first isolation groove on the base substrate, wherein the peripheral region comprises multiple circuit regions sequentially arranged along the direction away from the display region, and the first isolation groove is located between two adjacent circuit regions.

* * * * *